(12) United States Patent
Niwa et al.

(10) Patent No.: US 11,470,273 B2
(45) Date of Patent: Oct. 11, 2022

(54) SOLID-STATE IMAGING ELEMENT, IMAGING DEVICE, AND CONTROL METHOD OF SOLID-STATE IMAGING ELEMENT

(71) Applicant: Sony Semiconductor Solutions Corporation, Kanagawa (JP)

(72) Inventors: Atsumi Niwa, Kanagawa (JP); Yusuke Oike, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 174 days.

(21) Appl. No.: 16/962,783

(22) PCT Filed: Jan. 18, 2019

(86) PCT No.: PCT/JP2019/001517
§ 371 (c)(1),
(2) Date: Jul. 16, 2020

(87) PCT Pub. No.: WO2019/146527
PCT Pub. Date: Aug. 1, 2019

(65) Prior Publication Data
US 2020/0358977 A1 Nov. 12, 2020

(30) Foreign Application Priority Data
Jan. 23, 2018 (JP) .............................. JP2018-008850

(51) Int. Cl.
*H04N 5/3745* (2011.01)
*H04N 5/345* (2011.01)
(Continued)

(52) U.S. Cl.
CPC ....... *H04N 5/37455* (2013.01); *H04N 5/3454* (2013.01); *H04N 5/3456* (2013.01); *H04N 5/353* (2013.01)

(58) Field of Classification Search
CPC ............. H04N 5/37455; H04N 5/3454; H04N 5/3456; H04N 5/353; H04N 5/378;
(Continued)

(56) References Cited

U.S. PATENT DOCUMENTS

2010/0182468 A1  7/2010  Posch et al.
2014/0326854 A1* 11/2014  Delbruck ............. G01J 1/0238
                                                                 250/204
2016/0093273 A1*  3/2016  Wang .................... G01S 3/781
                                                                 345/428

(Continued)

FOREIGN PATENT DOCUMENTS

JP        2017-535999 A      11/2017

OTHER PUBLICATIONS

Brandli et al., "A 240 × 180 130 dB 3 µs Latency Global Shutter Spatiotemporal Vision Sensor", Oct. 2014, IEEE Journal of Solid-State Circuits, vol. 49, No. 10, pp. 2333-2340 (Year: 2014).*

(Continued)

*Primary Examiner* — Albert H Cutler
(74) *Attorney, Agent, or Firm* — Michael Best & Friedrich LLP

(57) ABSTRACT

An object is to reduce a circuit scale in a solid-state imaging element that detects an address event.

The solid-state imaging element is provided with a plurality of photoelectric conversion elements, a signal supply unit, and a detection unit. In this solid-state imaging element, each of the plurality of photoelectric conversion elements photoelectrically converts incident light to generate a first electric signal. Furthermore, in the solid-state imaging element, the detection unit detects whether or not a change amount of the first electric signal of each of the plurality of photoelectric conversion elements exceeds a predetermined threshold and outputs a detection signal indicating a result of the detection result.

18 Claims, 32 Drawing Sheets

(51) Int. Cl.
*H04N 5/353* (2011.01)
*H01L 27/146* (2006.01)
*H04N 5/378* (2011.01)
*H04N 5/369* (2011.01)
*H04N 5/374* (2011.01)

(58) Field of Classification Search
CPC .. H04N 5/379; H04N 5/37457; H04N 5/3745; H04N 5/3741; H01L 27/14609; H01L 27/14643; H01L 27/146
See application file for complete search history.

(56) References Cited

U.S. PATENT DOCUMENTS

2016/0249002 A1* 8/2016 Kim ................... H04N 5/3745
2017/0059399 A1   3/2017 Suh et al.

OTHER PUBLICATIONS

Brandli, Christian et al., "A 240 × 180 130 dB 3 µs Latency Global Shutter Spatiotemporal Vision Sensor" IEEE Journal of Solid-State Circuits, IEEE, USA, vol. 49, No. 10, Oct. 1, 2014 (Oct. 1, 2014), pp. 2333-2341, XP011559757, ISSN: 0018-9200, DOI: 10.1109/JSSC.2014.2342715 [retrieved on Sep. 22, 2014].
Extended European Search Report dated Oct. 28, 2020 for corresponding European Application No. 19744505.9.

* cited by examiner

SOLID-STATE IMAGING ELEMENT, IMAGING DEVICE, AND CONTROL METHOD OF SOLID-STATE IMAGING ELEMENT

TECHNICAL FIELD

The present technology relates to a solid-state imaging element, an imaging device, and a control method of a solid-state imaging element. More specifically, the present technology relates to a solid-state imaging element that compares an amount of incident light with a threshold, an imaging device, and a control method of a solid-state imaging element.

BACKGROUND ART

Conventionally, a synchronous solid-state imaging element that images image data (frame) in synchronization with a synchronization signal such as a vertical synchronization signal is used in an imaging device and the like. With this general synchronous solid-state imaging element, the image data may be obtained only at every synchronization signal cycle (for example, 1/60 second), so that it is difficult to cope with a case where higher-speed processing is requested in a field regarding traffic, robot and the like. Therefore, an asynchronous solid-state imaging element is proposed in which a detection circuit that detects in real time as an address event that a light amount of the pixel exceeds a threshold for each pixel address is provided for each pixel (refer to, for example, Patent Document 1). The solid-state imaging element that detects the address event for each pixel in this manner is referred to as a dynamic vision sensor (DVS).

CITATION LIST

Patent Document

Patent Document 1: Japanese Unexamined Patent Publication No. 2017-535999

SUMMARY OF THE INVENTION

Problems to be Solved by the Invention

The asynchronous solid-state imaging element (that is, DVS) described above may generate data at a much higher speed than that with the synchronous solid-state imaging element to output. For this reason, for example, in a traffic field, processing of recognizing an image of a person or an obstacle may be executed at a high speed to improve safety. However, a detection circuit of the address event has a larger number of elements such as transistors than a pixel circuit in the synchronous type, and there is a problem that, if such circuit is provided for each pixel, a circuit scale increases as compared with the synchronous type.

The present technology is achieved in view of such a situation, and an object thereof is to reduce the circuit scale in the solid-state imaging element that detects the address event.

Solutions to Problems

The present technology is made to solve the above-described problem, and a first aspect thereof is a solid-state imaging element provided with a plurality of photoelectric conversion elements each of which photoelectrically converts incident light to generate a first electric signal, and a detection unit that detects whether or not a change amount of the first electric signal of each of the plurality of photoelectric conversion elements exceeds a predetermined threshold and outputs a detection signal indicating a result of the detection, and a control method thereof. This brings about an effect that the detection result of detecting whether or not the change amount of the electric signals from the plurality of photoelectric conversion elements exceeds the threshold is output.

Furthermore, in the first aspect, a signal supply unit that supplies the first electric signal of each of the plurality of photoelectric conversion elements to a connection node according to a predetermined control signal may be further provided, in which the detection unit may detect whether or not the change amount of the first electric signal supplied to the connection node exceeds the predetermined threshold. This brings about an effect that the detection result of detecting whether or not the change amount of the electric signal supplied to the connection node by the signal supply unit exceeds the threshold is output.

Furthermore, in the first aspect, a pixel signal generation unit that generates a pixel signal according to a second electric signal generated by the photoelectric conversion element may be further provided, in which the signal supply unit may sequentially select the second electric signal of each of the plurality of photoelectric conversion elements to supply to the pixel signal generation unit in a case where the change amount exceeds the predetermined threshold. This brings about an effect that the pixel signals are sequentially generated in a case where the change amount exceeds the threshold.

Furthermore, in the first aspect, the connection node may be connected to N (N is an integer not smaller than 2) of the photoelectric conversion elements, and the pixel signal generation unit may generate a signal of a voltage corresponding to the second electric signal of an element selected according to a selection signal out of M (M is an integer smaller than N) of the photoelectric conversion elements as the pixel signal. This brings about an effect that it is detected that whether or not the change amount of the electric signals from the N photoelectric conversion elements exceeds the threshold, and the pixel signal is generated from a photo-current of the selected element out of the M photoelectric conversion elements.

Furthermore, in the first aspect, the pixel signal generation unit may be provided with a reset transistor that initializes a floating diffusion layer, an amplification transistor that amplifies a signal of a voltage of the floating diffusion layer, and a selection transistor that outputs the amplified signal as the pixel signal according to a selection signal, in which the detection unit may be provided with a plurality of N-type transistors that converts the first electric signal into a voltage signal of a logarithm of the first electric signal, and a P-type transistor that supplies a constant current to the plurality of N-type transistors. This brings about an effect that the pixel signal generation unit in which the transistors are arranged and the detection unit generate and detect the pixel signal.

Furthermore, in the first aspect, the plurality of photoelectric conversion elements may be arranged on a light reception chip, and the detection unit and the pixel signal generation unit may be arranged on a detection chip stacked on the light reception chip. This brings about an effect of increasing a light receiving area.

Furthermore, in the first aspect, the plurality of photoelectric conversion elements and the reset transistor may be arranged on a light reception chip, and the detection unit, the amplification transistor, and the selection transistor may be arranged on a detection chip stacked on the light reception chip. This brings about an effect that a circuit scale of the detection chip is reduced.

Furthermore, in the first aspect, the plurality of photoelectric conversion elements, the reset transistor, and the plurality of N-type transistors may be arranged on a light reception chip, and the amplification transistor, the selection transistor, and the P-type transistor may be arranged on a detection chip stacked on the light reception chip. This brings about an effect that a circuit scale of the detection chip is reduced.

Furthermore, in the first aspect, the plurality of photoelectric conversion elements, the pixel signal generation unit, and the plurality of N-type transistors may be arranged on a light reception chip, and the P-type transistor may be arranged on a detection chip stacked on the light reception chip. This brings about an effect that a circuit scale of the detection chip is reduced.

Furthermore, in the first aspect, a signal supply unit that supplies the first electric signal of each of the plurality of photoelectric conversion elements to a connection node according to a predetermined control signal may be further provided, in which the detection unit may further output a pixel signal corresponding to the first electric signal, the signal supply unit may sequentially select the first electric signal of each of the plurality of photoelectric conversion elements to supply to the connection node in a case where the change amount exceeds the predetermined threshold, and the detection unit may be provided with first and second N-type transistors that convert the first electric signal into a voltage signal of a logarithm of the first electric signal, and a P-type transistor that supplies a constant current to the first and second N-type transistors. This brings about an effect that the pixel signals are sequentially generated in a case where the change amount exceeds the threshold.

Furthermore, in the first aspect, an analog/digital converter that converts the pixel signal into a digital signal may be further provided, in which the plurality of photoelectric conversion elements, the signal supply unit, and the first and second N-type transistors may be arranged on a light reception chip, and the P-type transistor and at least a part of the analog/digital converter may be arranged on a detection chip stacked on the light reception chip. This brings about an effect that a circuit scale of the detection chip is reduced.

Furthermore, in the first aspect, the analog/digital converter may be provided with a signal side transistor to which the pixel signal is input, a reference side transistor to which a predetermined reference signal is input, a constant current source connected to the signal side transistor and the reference side transistor, and a current mirror circuit that amplifies a difference between the pixel signal and the predetermined reference signal to output, and the plurality of photoelectric conversion elements, the signal supply unit, the first and second N-type transistors, the signal side transistor, the reference side transistor, and the constant current source may be arranged on a light reception chip, and the P-type transistor and the current mirror circuit may be arranged on a detection chip stacked on the light reception chip. This brings about an effect that a circuit scale of the detection chip is reduced.

Furthermore, in the first aspect, a connection node connected to the photoelectric conversion element and the detection unit, and for each of the plurality of photoelectric conversion elements, a current/voltage conversion unit that converts a photocurrent into a voltage signal of a logarithm of the photocurrent, a buffer that corrects the voltage signal to output, a capacitor inserted between the buffer and the connection node, and a signal processing unit that supplies an electric signal of each of the plurality of photoelectric conversion elements to the connection node through the current/voltage conversion unit, the buffer, and the capacitor according to a predetermined control signal may be further provided, in which the electric signal may include the photocurrent and the voltage signal. This brings about an effect that the voltage signal of the logarithm of the photocurrent is supplied to the connection node.

Furthermore, in the first aspect, an analog/digital converter that converts a pixel signal into a digital signal may be further provided, in which each of a predetermined number of current/voltage conversion units arranged in a predetermined direction may further generate a signal of a voltage corresponding to the photocurrent as the pixel signal, and output the pixel signal to the analog/digital converter. This brings about an effect that the pixel signals of a predetermined number of pixels are sequentially converted into digital signals.

Furthermore, in the first aspect, an analog/digital converter that converts a pixel signal into a digital signal for each of the plurality of photoelectric conversion elements may be further provided, in which each of current/voltage conversion units may further generate a signal of a voltage corresponding to the photocurrent as the pixel signal, and output the pixel signal to the analog/digital converter. This brings about an effect that the pixel signal is converted into the digital signal for each pixel.

Furthermore, a second aspect of the present technology is a solid-state imaging element provided with a photoelectric conversion element that photoelectrically converts incident light to generate an electric signal, a signal supply unit that supplies the electric signal to either a connection node or a floating diffusion layer according to a predetermined control signal, a detection unit that detects whether or not a change amount of the electric signal supplied to the connection node exceeds a predetermined threshold and outputs a detection signal indicating a result of the detection, and a pixel signal generation unit that generates a voltage signal corresponding to the electric signal supplied to the floating diffusion layer as a pixel signal. Therefore, the pixel signal is generated for each pixel, and it is detected whether or not the change amount of the electric signal exceeds the threshold.

Furthermore, in the second aspect, the signal supply unit may include a first transistor that supplies the electric signal to the connection node according to a predetermined control signal, and a second transistor that supplies the electric signal to a floating diffusion layer according to a predetermined control signal, the pixel signal generation unit may be arranged in each of a plurality of pixels, and the first transistor and the detection unit may be arranged in a pixel being a detection target out of the plurality of pixels. This brings about an effect of reducing a circuit scale.

Furthermore, a third aspect of the present technology is an imaging device provided with a plurality of photoelectric conversion elements each of which photoelectrically converts incident light to generate an electric signal, a signal supply unit that supplies the electric signal of each of the plurality of photoelectric conversion elements to a connection node according to a predetermined control signal, a detection unit that detects whether or not a change amount of the electric signal supplied to the connection node exceeds a predetermined threshold and outputs a detection signal indicating a result of the detection, and a recording unit that records the detection signal. This brings about an effect that the detection result of detecting whether or not the change amount of the electric signals from the plurality of photoelectric conversion elements exceeds the threshold is recorded.

Furthermore, a fourth aspect of the present technology is a solid-state imaging element provided with a first photoelectric conversion element that generates a first electric signal, a second photoelectric conversion element that generates a second electric signal, a detection unit that detects whether or not at least any one of a change amount of the first electric signal or a change amount of the second electric signal exceeds a predetermined threshold to output a detection signal indicating a result of the detection, and a connection node connected to the first photoelectric conversion element, the second photoelectric conversion element, and the detection unit. This brings about an effect that the detection result of whether or not the change amount of the electric signal from any one of the plurality of photoelectric conversion elements exceeds the threshold is output.

Furthermore, in the fourth aspect, a first transistor that supplies the first electric signal to the connection node according to a first control signal, and a second transistor that supplies the second electric signal to the connection node according to a second control signal may be further provided, in which the detection unit may detect whether or not a change amount of either the first or second electric signal supplied to the connection node exceeds the predetermined threshold. This brings about an effect that the detection result of detecting whether or not the change amount of the electric signal supplied to the connection node by the signal supply unit exceeds the threshold is output.

Furthermore, in the fourth aspect, a pixel signal generating unit that generates a first pixel signal according to a third electric signal generated by the first photoelectric conversion element and generates a second pixel signal according to a fourth electric signal generated by the second photoelectric conversion element, a third transistor connected to the first photoelectric conversion element and the pixel signal generating unit, and a fourth transistor connected to the second photoelectric conversion element and the pixel signal generating unit may be further provided, in which the third transistor may supply the third electric signal to the pixel signal generating unit in a case where the change amount of the first electric signal exceeds the predetermined threshold, and the fourth transistor may supply the fourth electric signal to the pixel signal generating unit in a case where the change amount of the second electric signal exceeds the predetermined threshold. This brings about an effect that the pixel signals are sequentially generated in a case where the change amount exceeds the threshold.

Furthermore, in the fourth aspect, the pixel signal generating unit may include a first pixel signal generation unit that generates a first pixel signal according to the third electric signal generated by the first photoelectric conversion element, and a second pixel signal generation unit that generates a second pixel signal according to the fourth electric signal generated by the second photoelectric conversion element, in which the third transistor may supply the third electric signal to the first pixel signal generation unit in a case where the change amount of the first electric signal exceeds the predetermined threshold, and the fourth transistor may supply the fourth electric signal to the second pixel signal generation unit in a case where the change amount of the second electric signal exceeds the predetermined threshold. This brings about an effect that the pixel signals are sequentially generated in a case where the change amount exceeds the threshold.

Furthermore, in the fourth aspect, a third photoelectric conversion element that generates a fifth electric signal and a sixth electric signal, a fifth transistor that supplies an electric signal of the fifth photoelectric conversion element to the connection node according to a third control signal, and a second pixel signal generating unit that generates a third pixel signal according to the sixth electric signal may be further provided, in which the sixth transistor may supply the sixth electric signal to the second pixel signal generating unit in a case where a change amount of the fifth electric signal exceeds the predetermined threshold. This brings about an effect that the pixel signals are sequentially generated by the plurality of pixel signal generating units.

Furthermore, in the fourth aspect, the pixel signal generating unit may be provided with a reset transistor that initializes a floating diffusion layer, an amplification transistor that amplifies a signal of a voltage of the floating diffusion layer, and a selection transistor that outputs the amplified signal as the first or second pixel signal according to a selection signal, and the detection unit may be provided with a plurality of N-type transistors that converts a photocurrent into a voltage signal of a logarithm of the photocurrent, and a P-type transistor that supplies a constant current to the plurality of N-type transistors. This brings about an effect that the pixel signals are sequentially generated in a case where the change amount exceeds the threshold.

Furthermore, in the fourth aspect, the first electric signal may include a first photocurrent, and the second electric signal may include a second photocurrent, a connection node connected to the first photoelectric conversion element, the second photoelectric conversion element, and the detection unit, a first current/voltage conversion unit that converts at least one of the first photocurrent or the second photocurrent into a voltage signal of a logarithm of the photocurrent, a buffer that corrects the voltage signal to output, a capacitor inserted between the buffer and the connection node, and a signal processing unit that supplies at least one of the first electric signal or the second electric signal to the connection node through the current/voltage conversion unit, the buffer, and the capacitor according to a predetermined control signal may be further provided, in which the first photoelectric conversion element may generate the first photocurrent, and the second photoelectric conversion element may generate the second photocurrent. This brings about an effect that the voltage signal of the logarithm of the photocurrent is supplied to the connection node.

Furthermore, in the fourth aspect, an analog/digital converter connected to the first current/voltage conversion unit and the second current/voltage conversion unit may be further provided, in which the first current/voltage conversion unit may further generate a signal of a voltage corresponding to the first photocurrent as a first pixel signal, and output the first pixel signal to the analog/digital converter, and the second current/voltage conversion unit may further generate a signal of a voltage corresponding to the second photocurrent as a second pixel signal, and output the second pixel signal to the analog/digital converter. This brings about an effect that the pixel signals of a predetermined number of pixels are sequentially converted into digital signals.

Furthermore, in the fourth aspect, a first analog/digital converter that converts a first pixel signal into a first digital signal, and a second analog/digital converter that converts a second pixel signal into a second digital signal may be further provided, in which the first current/voltage conversion unit may further generate a signal of a voltage corresponding to the first photocurrent as the first pixel signal, and outputs the first pixel signal to the first analog/digital converter, and the second current/voltage conversion unit may further generate a signal of a voltage corresponding to the second photocurrent as the second pixel signal, and output the second pixel signal to the second analog/digital converter. This brings about an effect that the pixel signals of a predetermined number of pixels are sequentially converted into digital signals.

Furthermore, a fifth aspect of the present technology is a solid-state imaging element provided with a first photoelectric conversion element that photoelectrically converts incident light to generate a first electric signal and a second electric signal, a first signal supply unit that supplies the first electric signal to a connection node according to a first control signal, a second signal supply unit that supplies the second electric signal to a first floating diffusion layer according to a second control signal, a detection unit that detects whether or not a change amount of the first electric signal supplied to the connection node exceeds a predetermined threshold and outputs a detection signal indicating a result of the detection, and a first pixel signal generation unit that generates a first pixel signal corresponding to the second electric signal supplied to the first floating diffusion layer, and a control method thereof. This brings about an effect that the detection result of detecting whether or not the change amount of the electric signal supplied to the connection node exceeds the threshold is output.

Furthermore, in the fifth aspect, a second photoelectric conversion element that photoelectrically converts incident light to generate a third electric signal, a third transistor that supplies to a second floating diffusion layer according to a third control signal, and a second pixel signal generation unit that generates a voltage signal corresponding to the third electric signal supplied to the second floating diffusion layer as a second pixel signal may be further provided. This brings about an effect that the pixel signals are sequentially generated in a case where the change amount exceeds the threshold.

Furthermore, a sixth aspect of the present technology is an imaging device provided with a first photoelectric conversion element that photoelectrically converts incident light to generate a first electric signal, a second photoelectric conversion element that photoelectrically converts the incident light to generate a second electric signal, a first signal supply unit that supplies the first electric signal to a connection node according to a first control signal, a second signal supply unit that supplies the second electric signal to the connection node according to a second control signal, a detection unit that detects whether or not a change amount of the electric signal supplied to the connection node exceeds a predetermined threshold and outputs a detection signal indicating a result of the detection, and a recording unit that records the detection signal. This brings about an effect that the detection result of detecting whether or not the change amount of the electric signals from the plurality of photoelectric conversion elements exceeds the threshold is recorded.

Furthermore, a seventh aspect of the present technology is a solid-state imaging element provided with a first photoelectric conversion element that photoelectrically converts incident light to generate first and second electric signals, a second photoelectric conversion element that photoelectrically converts the incident light to generate third and fourth electric signals, a first detection unit that detects whether or not a change amount of the first electric signal exceeds a predetermined threshold and outputs a detection signal indicating a result of the detection, a second detection unit that detects whether or not a change amount of the third electric signal exceeds a predetermined threshold and outputs a detection signal indicating a result of the detection, a first transistor that supplies the first electric signal to the first detection unit according to a first control signal, a second transistor that supplies the third electric signal to the second detection unit according to a second control signal, a pixel signal generation unit that generates a pixel signal corresponding to any one of the second or fourth pixel signal, a third transistor that supplies the second electric signal to the pixel signal generation unit according to a third control signal, and a fourth transistor that supplies the fourth electric signal to the pixel signal generation unit according to a fourth control signal. This brings about an effect that the detection result of detecting whether or not the change amount of the electric signals from the plurality of photoelectric conversion elements exceeds the threshold is generated and the pixel signal is generated.

Effects of the Invention

According to the present technology, in a solid-state imaging element that detects an address event, an excellent effect that a circuit scale may be reduced may be obtained. Note that, the effects are not necessarily limited to the effects herein described and may be the effects described in the present disclosure.

MODE FOR CARRYING OUT THE INVENTION

Modes for carrying out the present technology (hereinafter, referred to as embodiments) are hereinafter described. The description is given in the following order.

1. First Embodiment (example in which a plurality of pixels shares an address event detection unit)

2. Second Embodiment (example in which pixel signal generation units are reduced and a plurality of pixels shares an address event detection unit)

3. Third Embodiment (example in which a plurality of pixels each provided with a capacitor shares an address event detection unit)

4. Fourth Embodiment (example in which an address event detection unit is arranged for each pixel)

5. Fifth Embodiment (example in which the number of pixels sharing an image signal generation unit is smaller than the number of pixels sharing an address event detection unit)

6. Application Example to Mobile Body

1. First Embodiment

[Configuration Example of Imaging Device]

Figure 1:
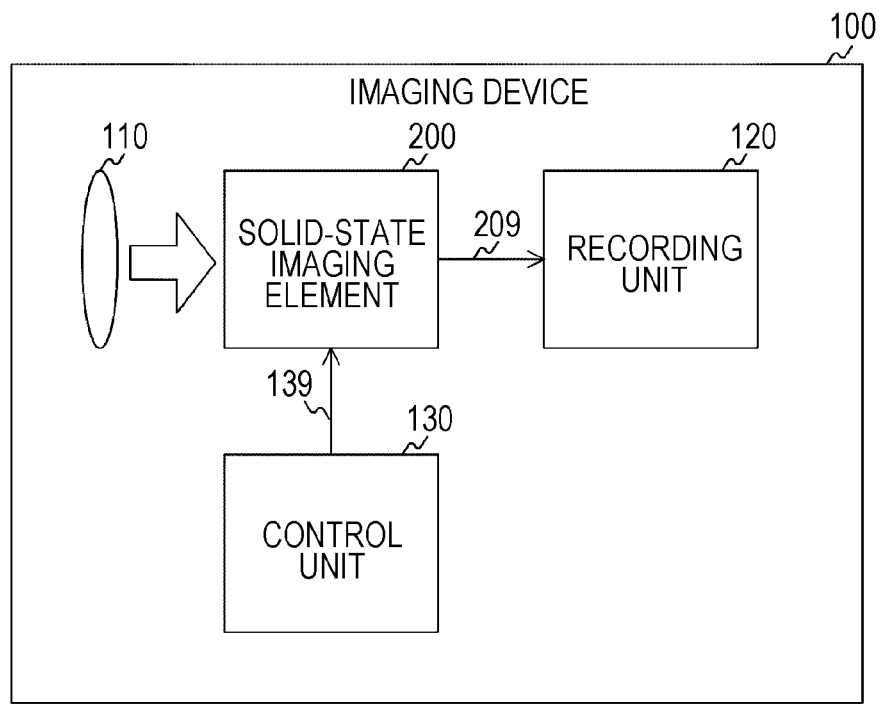
FIG. 1 is a block diagram illustrating a configuration example of an imaging device in a first embodiment of the present technology.

FIG. 1 is a block diagram illustrating a configuration example of an imaging device 100 in a first embodiment of the present technology. The imaging device 100 is provided with an imaging lens 110, a solid-state imaging element 200, a recording unit 120, and a control unit 130. As the imaging device 100, a camera mounted on an industrial robot, an in-vehicle camera and the like are assumed.

The imaging lens 110 condenses incident light and guides the same to the solid-state imaging element 200. The solid-state imaging element 200 photoelectrically converts the incident light to image image data. The solid-state imaging element 200 executes predetermined signal processing such as image recognition processing on the imaged image data, and outputs data indicating a processing result and a detection signal of an address event to the recording unit 120 via a signal line 209. A generating method of the detection signal is described later.

The recording unit 120 records the data from the solid-state imaging element 200. The control unit 130 controls the solid-state imaging element 200 to image the image data.

[Configuration Example of Solid-State Imaging Element]

Figure 2:
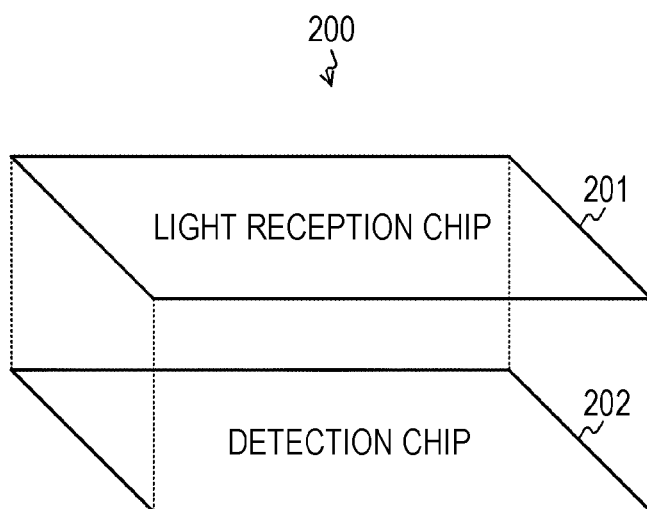
FIG. 2 is a view illustrating an example of a stacking structure of a solid-state imaging element in the first embodiment of the present technology.

FIG. 2 is a view illustrating an example of a stacking structure of the solid-state imaging element 200 in the first embodiment of the present technology. The solid-state imaging element 200 is provided with a detection chip 202 and a light reception chip 201 stacked on the detection chip 202. These chips are electrically connected to each other via a connection unit such as a via. Note that, they may also be connected to each other by Cu—Cu joint or a bump in addition to the via.

Figure 3:
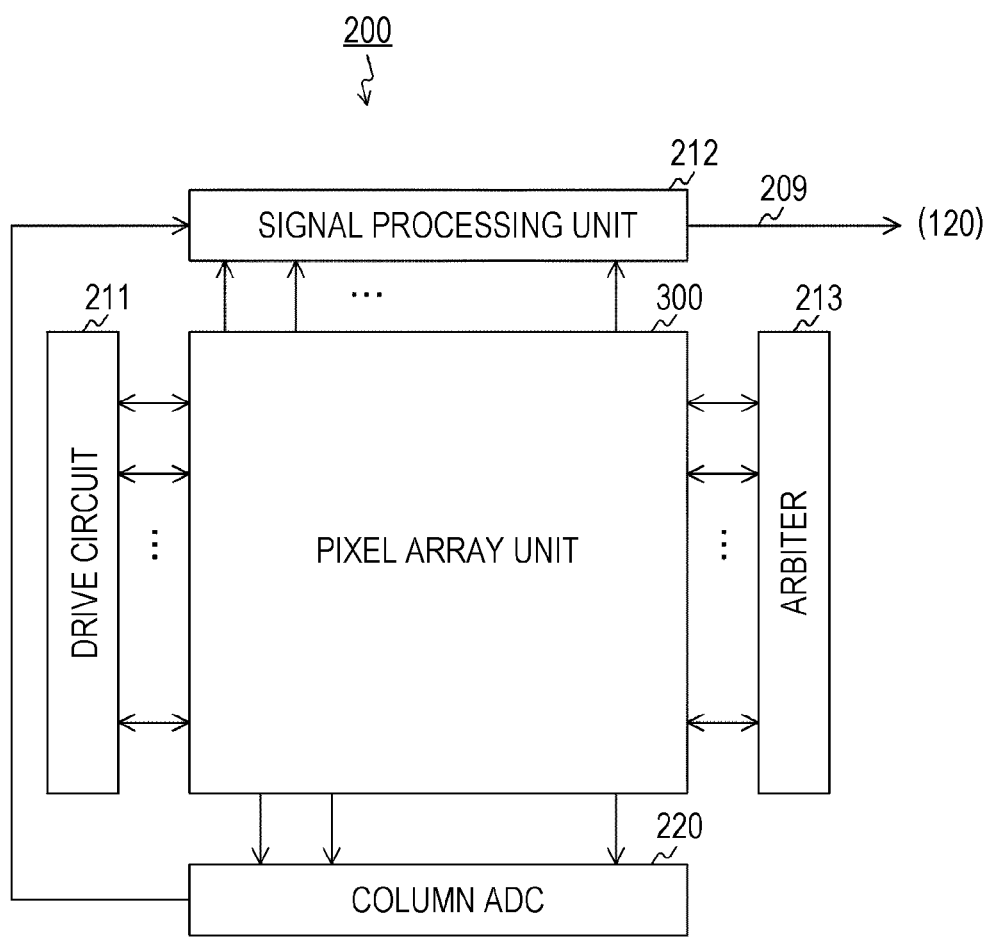
FIG. 3 is a block diagram illustrating a configuration example of the solid-state imaging element in the first embodiment of the present technology.

FIG. 3 is a block diagram illustrating a configuration example of the solid-state imaging element 200 in the first embodiment of the present technology. The solid-state imaging element 200 is provided with a drive circuit 211, a signal processing unit 212, an arbiter 213, a column ADC 220, and a pixel array unit 300.

In the pixel array unit 300, a plurality of pixels is arranged in a two-dimensional lattice manner. Furthermore, the pixel array unit 300 is divided into a plurality of pixel blocks each of which includes a predetermined number of pixels. Hereinafter, a set of pixels or pixel blocks arranged in a horizontal direction is referred to as a "row", and a set of pixels or pixel blocks arranged in a direction perpendicular to the row is referred to as a "column".

Each of the pixels generates an analog signal of a voltage corresponding to a photocurrent as a pixel signal. Furthermore, each of the pixel blocks detects presence/absence of the address event depending on whether or not a change amount of the photocurrent exceeds a predetermined threshold. Then, when the address event occurs, the pixel block outputs a request to the arbiter.

The drive circuit 211 drives each of the pixels to allow the same to output the pixel signal to the column ADC 220.

The arbiter 213 arbitrates the request from each pixel block and transmits a response to the pixel block on the basis of an arbitration result. The pixel block that receives the response supplies a detection signal indicating a detection result to the drive circuit 211 and the signal processing unit 212.

The column ADC 220 converts, for each column of the pixel blocks, the analog pixel signals from the column into digital signals. The column ADC 220 supplies the digital signals to the signal processing unit 212.

The signal processing unit 212 executes predetermined signal processing such as correlated double sampling (CDS) processing and image recognition processing on the digital signals from the column ADC 220. The signal processing unit 212 supplies data indicating a processing result and the detection signal to the recording unit 120 via the signal line 209.

[Configuration Example of Pixel Array Unit]

Figure 4:
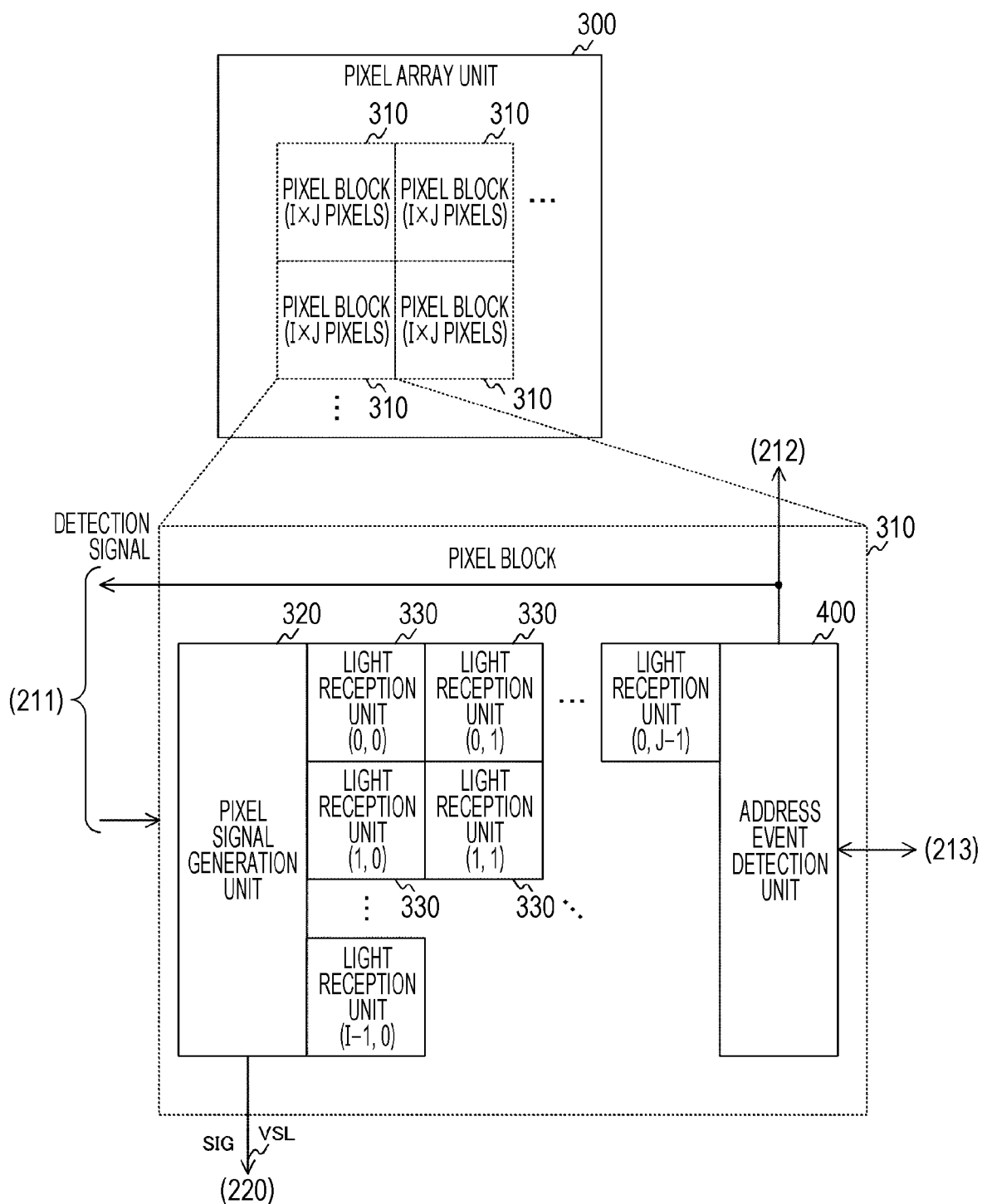
FIG. 4 is a block diagram illustrating a configuration example of a pixel array unit in the first embodiment of the present technology.

FIG. 4 is a block diagram illustrating a configuration example of the pixel array unit 300 in the first embodiment of the present technology. The pixel array unit 300 is divided into a plurality of pixel blocks 310. In each of the pixel blocks 310, a plurality of pixels is arranged in I rows×J columns (I and J are integers).

Furthermore, the pixel block 310 is provided with a pixel signal generation unit 320, a plurality of light reception units 330 of I rows×J columns, and an address event detection unit 400. The plurality of light reception units 330 in the pixel block 310 shares the pixel signal generation unit 320 and the address event detection unit 400. Then, a circuit including the light reception unit 330 at certain coordinates, the pixel signal generation unit 320, and the address event detection unit 400 serves as a pixel at the coordinates. Furthermore, a vertical signal line VSL is arranged for each column of the pixel blocks 310. When the number of columns of the pixel blocks 310 is set to m (m is an integer), m vertical signal lines VSL are arranged.

The light reception unit 330 photoelectrically converts the incident light to generate the photocurrent. The light reception unit 330 supplies the photocurrent to either the pixel signal generation unit 320 or the address event detection unit 400 under the control of the drive circuit 211.

The pixel signal generation unit 320 generates a signal of the voltage corresponding to the photocurrent as a pixel signal SIG. The pixel signal generation unit 320 supplies the generated pixel signal SIG to the column ADC 220 via the vertical signal line VSL.

The address event detection unit 400 detects the presence/absence of the address event on the basis of whether or not the change amount of the photocurrent from each of the light reception units 330 exceeds a predetermined threshold. The address event includes, for example, an on-event indicating that the change amount exceeds an upper limit threshold and an off-event indicating that the change amount falls below a lower limit threshold. Furthermore, the detection signal of the address event includes, for example, one bit indicating a detection result of the on-event and one bit indicating a detection result of the off-event. Note that, it is also possible that the address event detection unit 400 detects only the on-event.

When the address event occurs, the address event detection unit 400 supplies a request for transmission of the detection signal to the arbiter 213. Then, upon receiving a response to the request from the arbiter 213, the address event detection unit 400 supplies the detection signal to the drive circuit 211 and the signal processing unit 212. Note that, the address event detection unit 400 is an example of a detection unit recited in claims.

[Configuration Example of Pixel Block]

Figure 5:
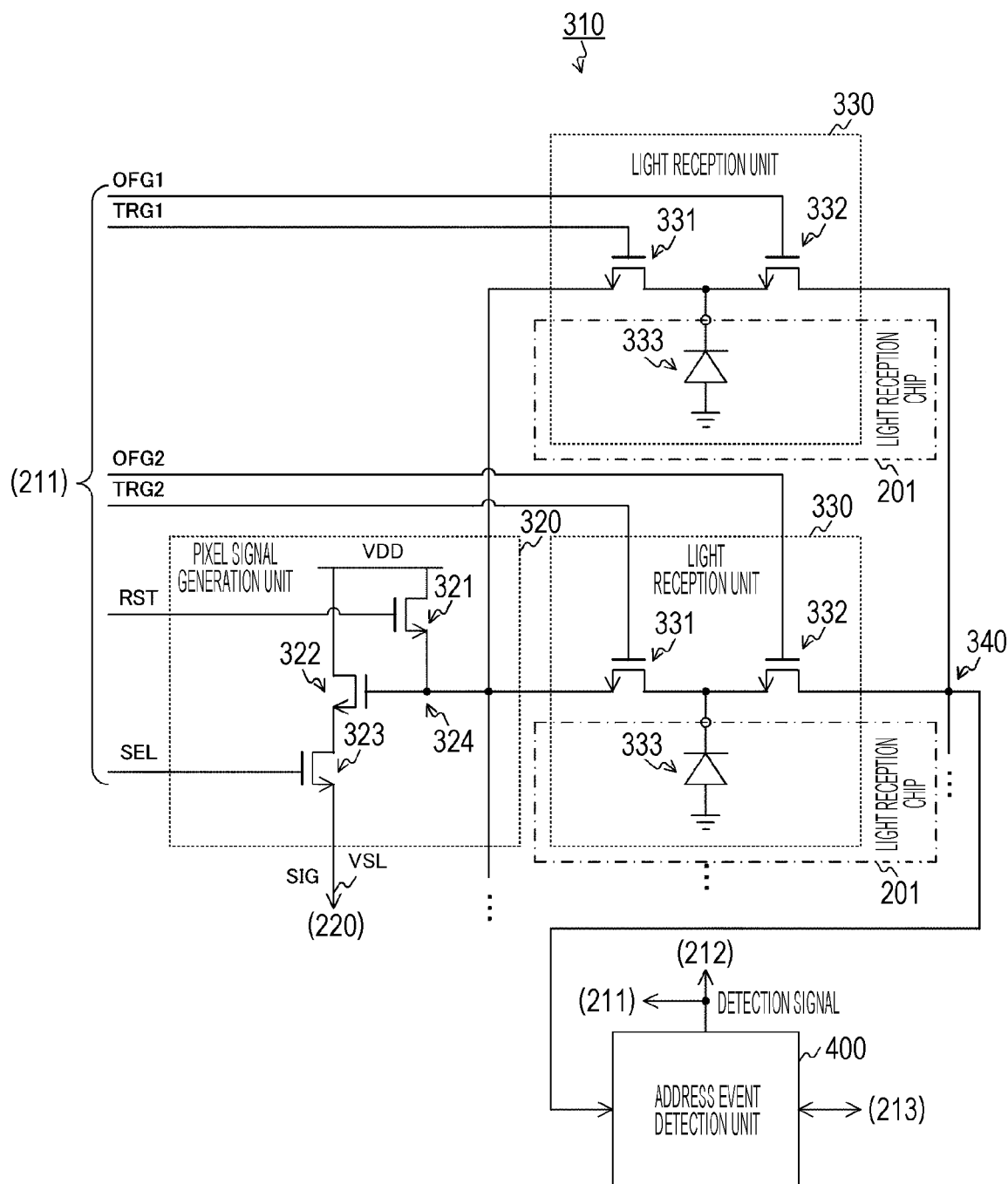
FIG. 5 is a circuit diagram illustrating a configuration example of a pixel block in the first embodiment of the present technology.

FIG. 5 is a circuit diagram illustrating a configuration example of the pixel block 310 in the first embodiment of the present technology. In the pixel block 310, the pixel signal generation unit 320 is provided with a reset transistor 321, an amplification transistor 322, a selection transistor 323, and a floating diffusion layer 324. The plurality of light reception units 330 is commonly connected to the address event detection unit 400 via a connection node 340.

Furthermore, each of the light reception units 330 is provided with a transfer transistor 331, an overflow gate (OFG) transistor 332, and a photoelectric conversion element 333. When the number of pixels in the pixel block 310 is set to N (N is an integer), N transfer transistors 331, N OFG transistors 332, and N photoelectric conversion elements 333 are arranged. A transfer signal TRGn is supplied to an n-th (n is an integer from 1 to N) transfer transistor 331 in the pixel block 310 by the drive circuit 211. A control signal OFGn is supplied to an n-th OFG transistor 332 by the drive circuit 211.

Furthermore, as the reset transistor 321, the amplification transistor 322, and the selection transistor 323, for example, N-type metal-oxide-semiconductor (MOS) transistors are used. The N-type MOS transistors are similarly used for the transfer transistor 331 and the OFG transistor 332.

Furthermore, each of the photoelectric conversion elements 333 is arranged on the light reception chip 201. All the elements other than the photoelectric conversion element 333 are arranged on the detection chip 202.

The photoelectric conversion element 333 photoelectrically converts the incident light to generate charge. The transfer transistor 331 transfers the charge from the corresponding photoelectric conversion element 333 to the floating diffusion layer 324 according to the transfer signal TRGn. The OFG transistor 332 supplies an electric signal generated by the corresponding photoelectric conversion element 333 to the connection node 340 according to the control signal OFGn. Here, the supplied electric signal is the photocurrent including the charge. Note that, a circuit including the transfer transistor 331 and the OFG transistor 332 of each pixel is an example of a signal supply unit recited in claims.

The floating diffusion layer 324 accumulates the charge and generates a voltage corresponding to an amount of the accumulated charge. The reset transistor 321 initializes the charge amount of the floating diffusion layer 324 according to a reset signal from the drive circuit 211. The amplification transistor 322 amplifies the voltage of the floating diffusion layer 324. The selection transistor 323 outputs a signal of the amplified voltage as the pixel signal SIG to the column ADC 220 via the vertical signal line VSL according to a selection signal SEL from the drive circuit 211.

When being instructed by the control unit 130 to start detecting the address event, the drive circuit 211 drives the OFG transistors 332 of all the pixels by the control signal OFGn to allow the same to supply the photocurrent. Therefore, the address event detection unit 400 is supplied with a current that is the sum of the photocurrents of all the light reception units 330 in the pixel block 310.

Then, when the address event is detected in a certain pixel block 310, the drive circuit 211 turns off all the OFG transistors 332 in this block to stop supplying the photocurrent to the address event detection unit 400. Next, the drive circuit 211 sequentially drives the transfer transistors 331 by the transfer signal TRGn to transfer the charge to the floating diffusion layer 324. Therefore, the pixel signals of the plurality of pixels in the pixel block 310 are sequentially output.

In this manner, the solid-state imaging element 200 outputs only the pixel signal of the pixel block 310 in which the address event is detected to the column ADC 220. Therefore, it is possible to reduce power consumption of the solid-state imaging element 200 and a processing amount of the image processing as compared with a case where the pixel signals of all the pixels are output regardless of the presence/absence of the address event.

Furthermore, since a plurality of pixels shares the address event detection unit 400, it is possible to reduce a circuit scale of the solid-state imaging element 200 as compared with a case where the address event detection unit 400 is arranged for each pixel.

[Configuration Example of Address Event Detection Unit]

Figure 6:
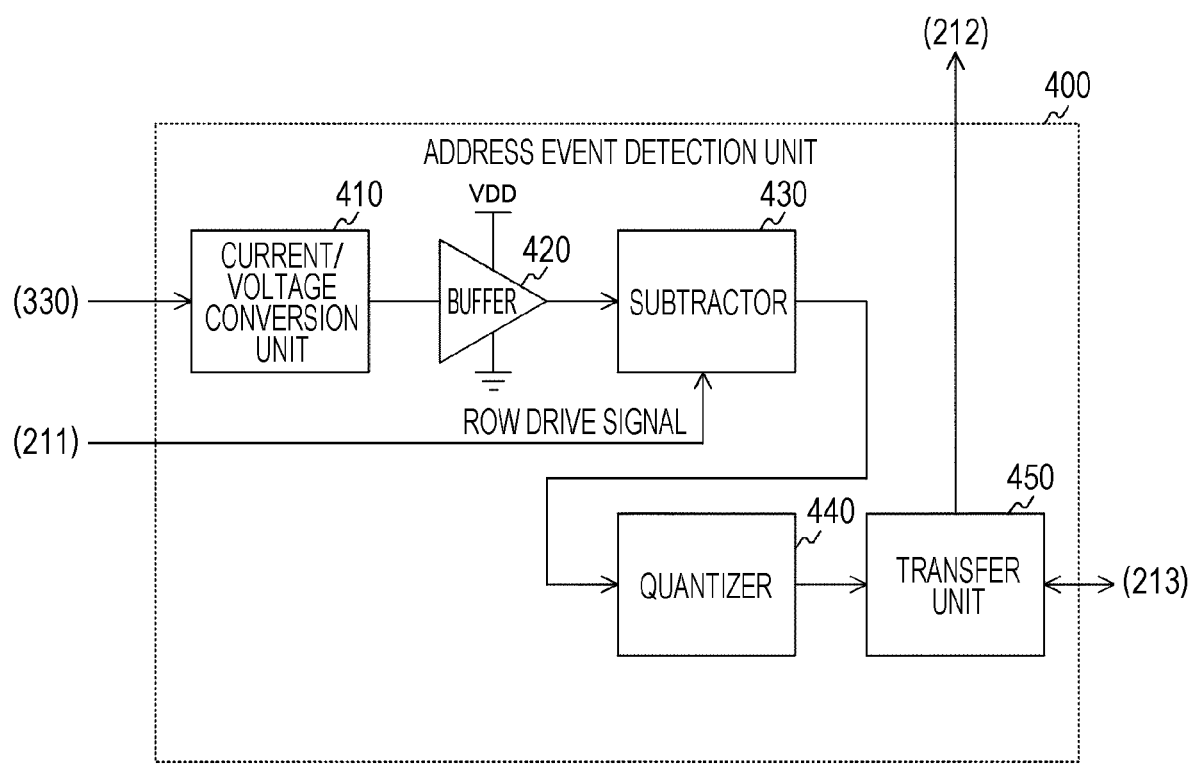
FIG. 6 is a block diagram illustrating a configuration example of an address event detection unit in the first embodiment of the present technology.

FIG. 6 is a block diagram illustrating a configuration example of the address event detection unit 400 in the first embodiment of the present technology. The address event detection unit 400 is provided with a current/voltage conversion unit 410, a buffer 420, a subtractor 430, a quantizer 440, and a transfer unit 450.

The current/voltage conversion unit 410 converts the photocurrent from the corresponding light reception unit 330 into a voltage signal of its logarithm. The current/voltage conversion unit 410 supplies the voltage signal to the buffer 420.

The buffer 420 corrects the voltage signal from the current/voltage conversion unit 410. The buffer 420 outputs the corrected voltage signal to the subtractor 430.

The subtractor 430 lowers a level of the voltage signal from the buffer 420 according to a row drive signal from the drive circuit 211. The subtractor 430 supplies the lowered voltage signal to the quantizer 440.

The quantizer 440 quantizes the voltage signal from the subtractor 430 into a digital signal and outputs the same as the detection signal to the transfer unit 450.

The transfer unit 450 transfers the detection signal from the quantizer 440 to the signal processing unit 212 and the like. When the address event is detected, the transfer unit 450 supplies the request for the transmission of the detection signal to the arbiter 213. Then, upon receiving the response to the request from the arbiter 213, the transfer unit 450 supplies the detection signal to the drive circuit 211 and the signal processing unit 212.

[Configuration Example of Current/Voltage Conversion Unit]

Figure 7:
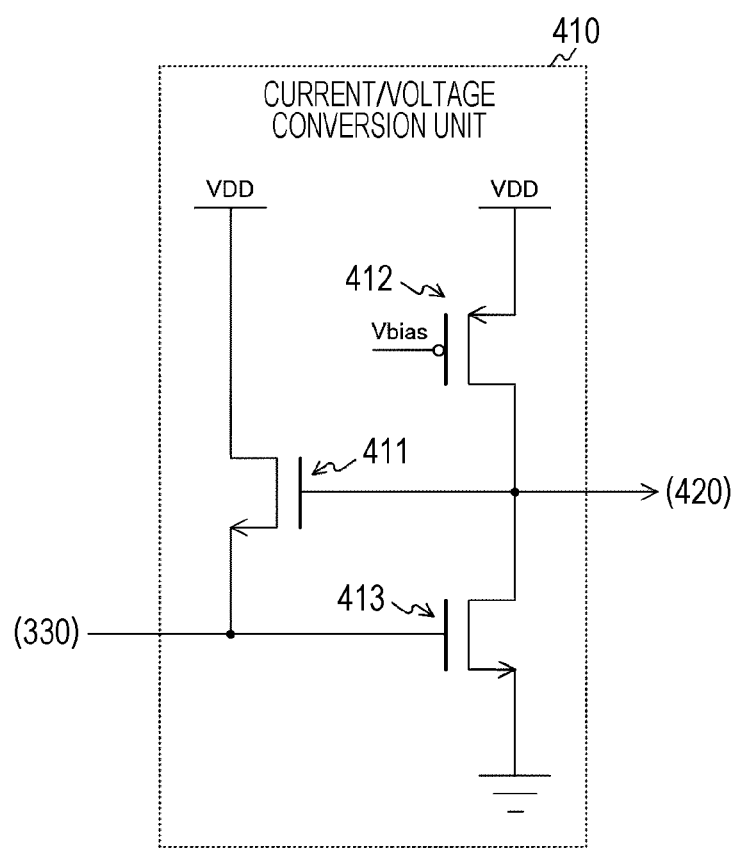
FIG. 7 is a circuit diagram illustrating a configuration example of a current/voltage conversion unit in the first embodiment of the present technology.

FIG. 7 is a circuit diagram illustrating a configuration example of the current/voltage conversion unit 410 in the first embodiment of the present technology. The current/voltage conversion unit 410 is provided with N-type transistors 411 and 413 and a P-type transistor 412. For example, MOS transistors are used as these transistors.

A source and a drain of the N-type transistor 411 are connected to the light reception unit 330 and a power supply terminal, respectively. The P-type transistor 412 and the N-type transistor 413 are connected in series between a power supply terminal and a ground terminal. Furthermore, a connection point between the P-type transistor 412 and the N-type transistor 413 is connected to a gate of the N-type transistor 411 and an input terminal of the buffer 420.

Furthermore, a predetermined bias voltage Vbias is applied to a gate of the P-type transistor 412.

Drains of the N-type transistors 411 and 413 are connected to a power supply side, and such circuits are referred to as source followers. The photocurrent from the light reception unit 330 is converted into the voltage signal of its logarithm by the two source followers connected into a loop. Furthermore, the P-type transistor 412 supplies a constant current to the N-type transistor 413.

[Configuration Example of Subtractor and Quantizer]

Figure 8:
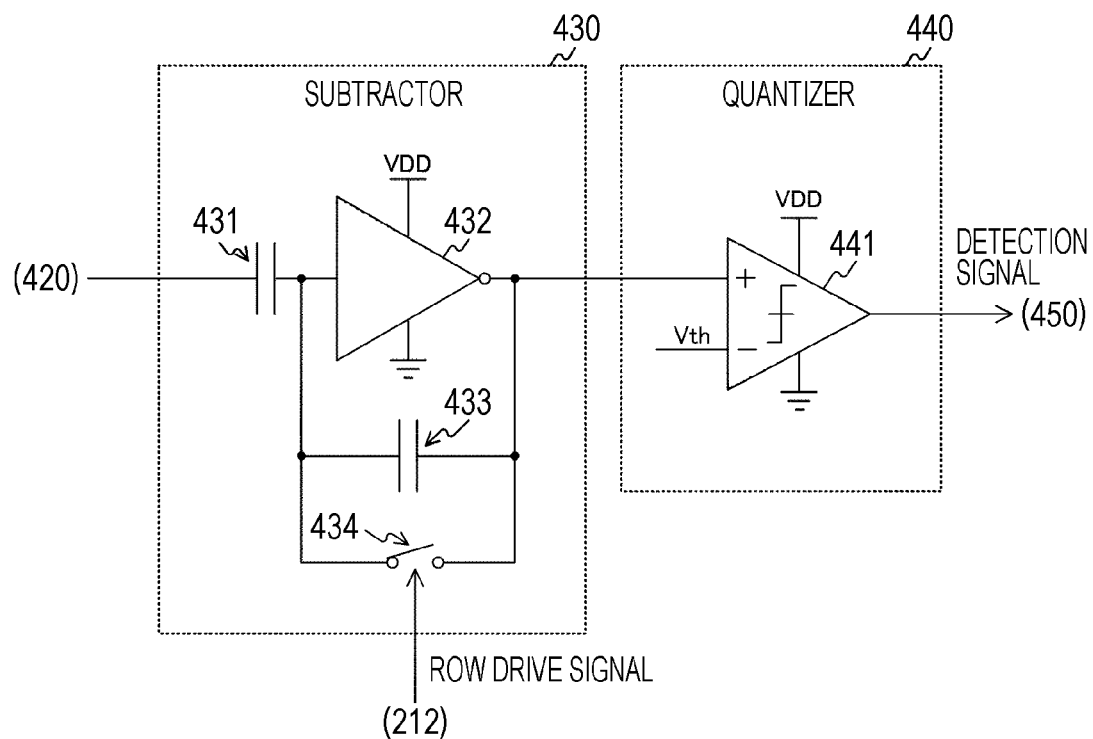
FIG. 8 is a circuit diagram illustrating a configuration example of a subtractor and a quantizer in the first embodiment of the present technology.

FIG. 8 is a circuit diagram illustrating a configuration example of the subtractor 430 and the quantizer 440 in the first embodiment of the present technology. The subtractor 430 is provided with capacitors 431 and 433, an inverter 432, and a switch 434. Furthermore, the quantizer 440 is provided with a comparator 441.

One end of the capacitor 431 is connected to an output terminal of the buffer 420 and the other end thereof is connected to an input terminal of the inverter 432. The capacitor 433 is connected in parallel with the inverter 432. The switch 434 opens/closes a path connecting both ends of the capacitor 433 according to the row drive signal.

The inverter 432 inverts the voltage signal input via the capacitor 431. The inverter 432 outputs the inverted signal to a non-inverting input terminal (+) of the comparator 441.

When the switch 434 is turned on, a voltage signal $V_{init}$ is input to a buffer 420 side of the capacitor 431, and the opposite side becomes a virtual ground terminal. Potential of this virtual ground terminal is set to zero for convenience. At that time, potential $Q_{init}$ accumulated in the capacitor 431 is expressed by a following expression when capacitance of the capacitor 431 is set to C1. On the other hand, since both the ends of the capacitor 433 are short-circuited, the accumulated charge thereof is zero.

$$Q_{init}=C1\times V_{init} \qquad \text{Expression 1}$$

Next, considering a case where the switch 434 is turned off and the voltage on the buffer 420 side of the capacitor 431 changes to $V_{after}$, charge $Q_{after}$ accumulated in the capacitor 431 is expressed by a following expression.

$$Q_{after}=C1\times V_{after} \qquad \text{Expression 2}$$

On the other hand, charge Q2 accumulated in the capacitor 433 is expressed by a following expression when an output voltage is set to $V_{out}$.

$$Q2=-C2\times V_{out} \qquad \text{Expression 3}$$

At that time, a total charge amount of the capacitors 431 and 433 does not change, so that following expression holds.

$$Q_{init}=Q_{after}+Q2 \qquad \text{Expression 4}$$

By substituting Expressions 1 to 3 into Expression 4 and transforming, a following expression is obtained.

$$V_{out}=-(C1/C2)\times(V_{after}-V_{init}) \qquad \text{Expression 5}$$

Expression 5 expresses a subtracting operation of the voltage signal, and a gain of a subtraction result is C1/C2. Since it is generally desired to maximize the gain, it is preferable to design C1 larger and C2 smaller. On the other hand, if C2 is too small, kTC noise increases, and there is a possibility that a noise characteristic deteriorates, so that a reduction in capacitance of C2 is limited to a range in which the noise may be allowed. Furthermore, since the address event detection unit 400 including the subtractor 430 is mounted for each pixel block, there is a limitation in area of the capacitance C1 and the capacitance C2. In consideration of them, values of the capacitance C1 and the capacitance C2 are determined.

The comparator 441 compares the voltage signal from the subtractor 430 with a predetermined threshold voltage Vth applied to an inverting input terminal (−). The comparator 441 outputs a signal indicating a comparison result to the transfer unit 450 as the detection signal.

Furthermore, a gain A of an entire address event detection unit 400 described above is expressed by a following expression when a conversion gain of the current/voltage conversion unit 410 is set to $CG_{log}$ and a gain of the buffer 420 is set to "1".

[Mathematical Expression 1]

[Mathematical expression 1]

$$A = \frac{CG_{log} \cdot C1}{C2} \sum_{n=1}^{N} i_{photo\_n} \qquad \text{Expression 6}$$

In the above expression, $i_{photo\_n}$ represents the photocurrent of the n-th pixel, and its unit is, for example, ampere (A). N represents the number of pixels in the pixel block 310.

[Configuration Example of Column ADC]

Figure 9:
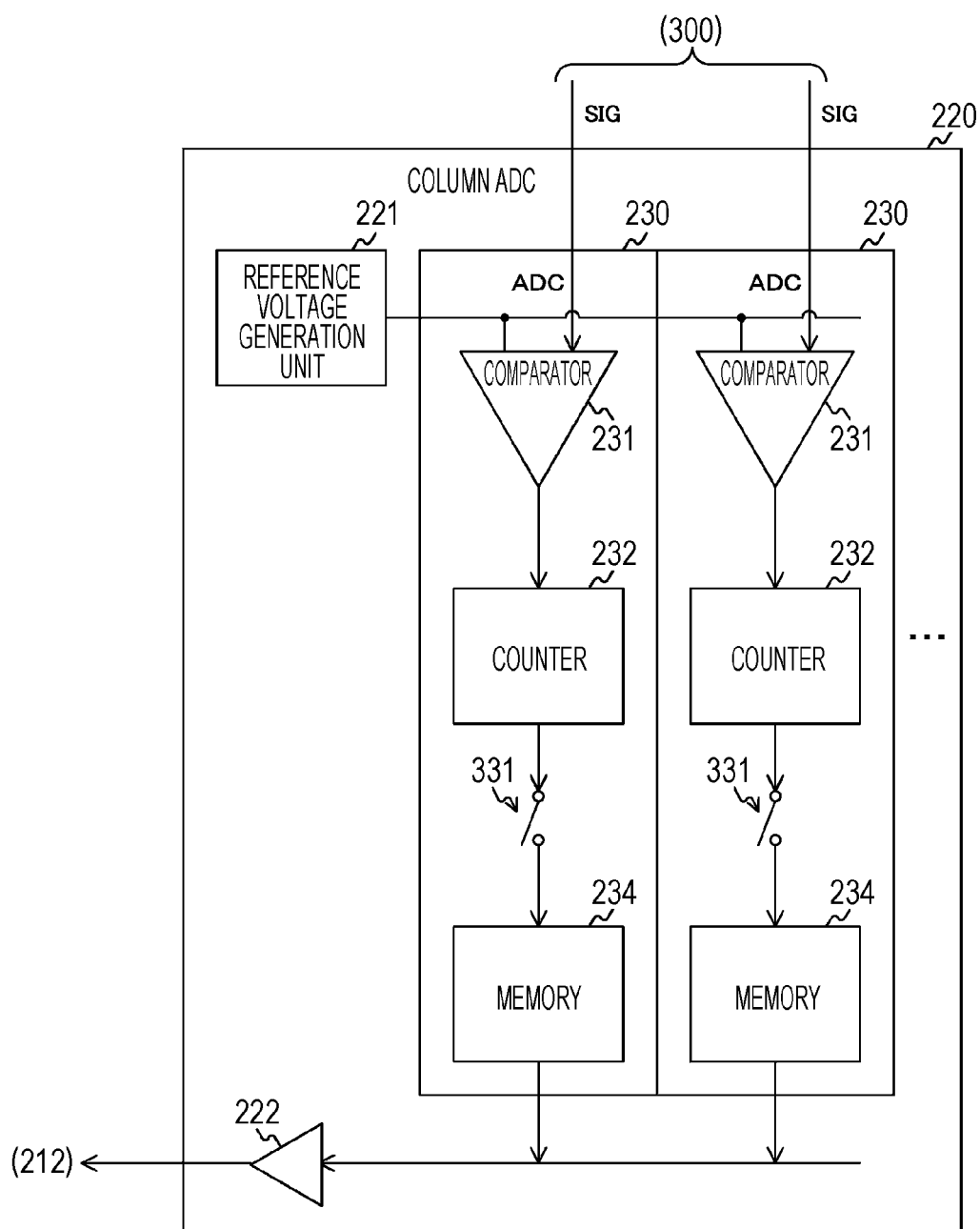
FIG. 9 is a block diagram illustrating a configuration example of a column analog-to-digital converter (ADC) in the first embodiment of the present technology.

FIG. 9 is a block diagram illustrating a configuration example of the column ADC 220 in the first embodiment of the present technology. The column ADC 220 is provided with an ADC 230 for each column of the pixel block 310. Furthermore, the column ADC 220 is provided with a reference signal generation unit 231 and an output unit 232. The reference signal generation unit 231 generates a reference signal such as a ramp signal and supplies the same to each of the ADCs 230. A digital to analog converter (DAC) and the like is used as the reference signal generation unit 231. The output unit 232 supplies the digital signal from the ADC 230 to the signal processing unit 212.

The ADC 230 converts an analog pixel signal SIG supplied via the vertical signal line VSL into a digital signal. The ADC 230 is provided with a comparator 231, a counter 232, a switch 233, and a memory 234. The comparator 231 compares the reference signal with the pixel signal SIG, and the counter 232 counts a count value over a period until a comparison result is inverted. The switch 233 supplies the count value to the memory 234 and allows the same to hold the count value under the control of a timing control circuit (not illustrated) and the like. The memory 234 supplies a digital signal indicating the count value to the output unit 232 under the control of a horizontal drive unit (not illustrated) and the like. With this configuration, the pixel signal SIG is converted into a digital signal having a larger bit depth than that of the detection signal. For example, if the detection signal is of two bits, the pixel signal is converted into the digital signal of three or more bits (16 bits and the like). Note that, the ADC 230 is an example of an analog/digital converter recited in claims.

[Operation Example of Solid-State Imaging Element]

Figure 10:
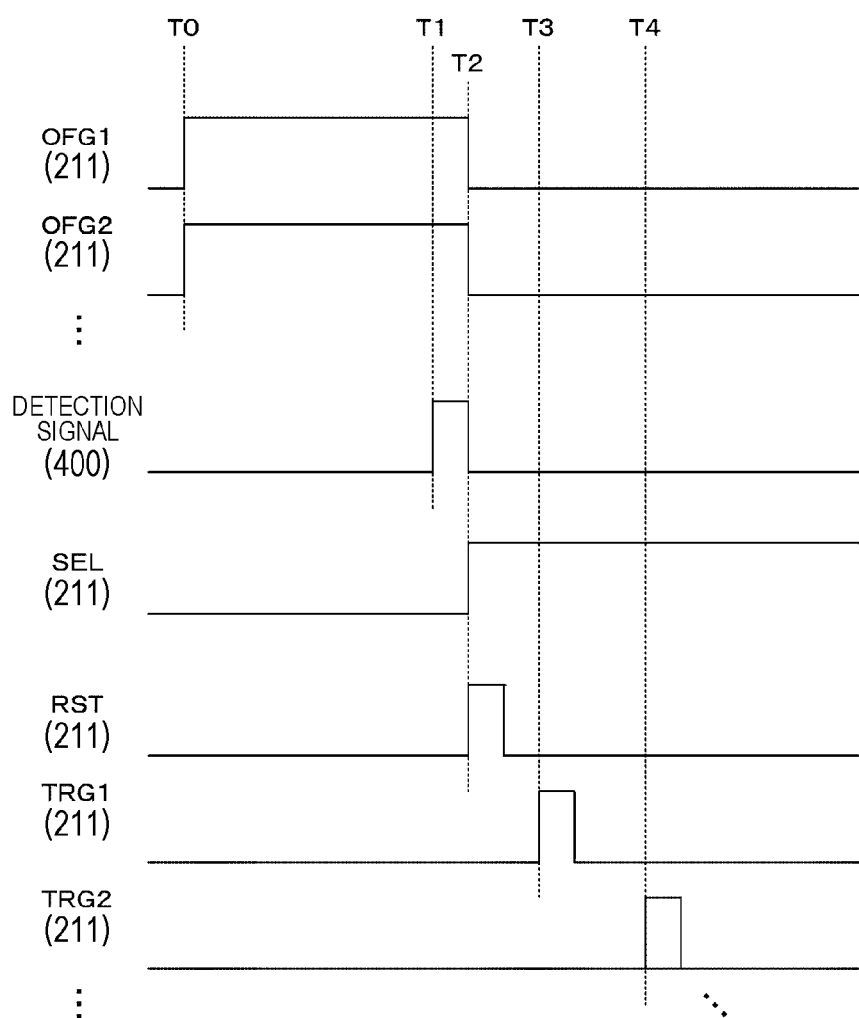
FIG. 10 is a timing chart illustrating an example of an operation of the solid-state imaging element in the first embodiment of the present technology.

FIG. 10 is a timing chart illustrating an example of an operation of the solid-state imaging element 200 in the first embodiment of the present technology. At timing T0, when being instructed by the control unit 130 to start detecting the address event, the drive circuit 211 sets all the control signals OFGn to a high level to turn on the OFG transistors 332 of all the pixels. Therefore, the sum of the photocurrents of all the pixels is supplied to the address event detection unit 400. On the other hand, all the transfer signals TRGn are at a low level, and the transfer transistors 331 of all the pixels are in an off state.

Then, suppose that the address event detection unit 400 detects the address event and outputs a high-level detection signal at timing T1. Here, suppose that the detection signal is a one-bit signal indicating the detection result of the on-event.

Upon receiving the detection signal, the drive circuit 211 sets all the control signals OFGn to a low level to stop supplying the photocurrent to the address event detection unit 400 at timing T2. Furthermore, the drive circuit 211 sets the selection signal SEL to a high level and sets a reset signal RST to a high level over a certain pulse period to initialize the floating diffusion layer 324. The pixel signal generation unit 320 outputs a voltage at the initialization as a reset level, and the ADC 230 converts the reset level into a digital signal.

At timing T3 after the conversion of the reset level, the drive circuit 211 supplies a high-level transfer signal TRG1 over a certain pulse period to allow a first pixel to output a voltage as a signal level. The ADC 230 converts the signal level into a digital signal. The signal processing unit 212 obtains a difference between the reset level and the signal level as a net pixel signal. This processing is referred to as the CDS processing.

At timing T4 after the conversion of the signal level, the drive circuit 211 supplies a high-level transfer signal TRG2 over a certain pulse period to allow a second pixel to output a signal level. The signal processing unit 212 obtains a difference between the reset level and the signal level as a net pixel signal. Thereafter, similar processing is executed, and the pixel signals of the respective pixels in the pixel block 310 are sequentially output.

When all the pixel signals are output, the drive circuit 211 sets all the control signals OFGn to the high level and turns on the OFG transistors 332 of all the pixels.

Figure 11:
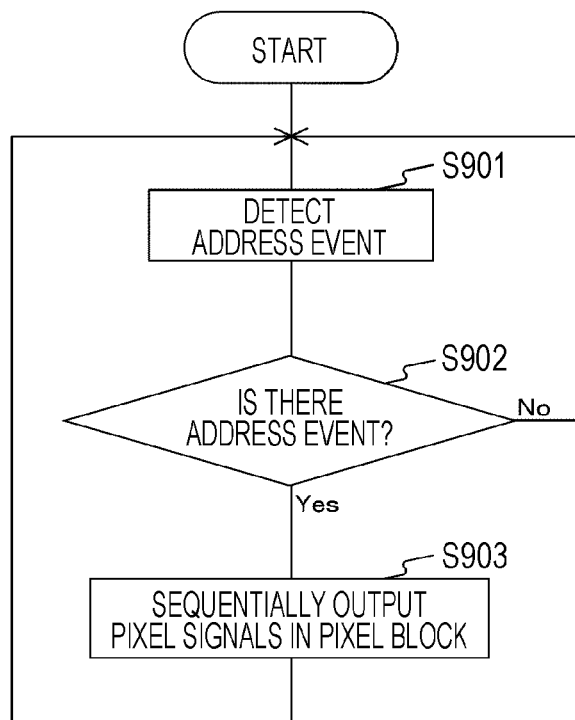
FIG. 11 is a flowchart illustrating an example of an operation of the solid-state imaging element in the first embodiment of the present technology.

FIG. 11 is a flowchart illustrating an example of the operation of the solid-state imaging element 200 in the first embodiment of the present technology. This operation starts, for example, when a predetermined application for detecting the address event is executed.

Each of the pixel blocks 310 detects the presence/absence of the address event (step S901). The drive circuit 211 determines whether or not there is the address event in any of the pixel blocks 310 (step S902). In a case where there is the address event (step S902: Yes), the drive circuit 211 allows the respective pixels in the pixel block 310 in which the address event occurs to sequentially output the pixel signals (step S903).

In a case where there is no address event (step S902: No) or after step S903, the solid-state imaging element 200 repeats step S901 and subsequent steps.

In this manner, according to the first embodiment of the present technology, the address event detection unit 400 detects the change amount of the photocurrent of each of the plurality of (N) photoelectric conversion elements 333 (pixels), so that it is possible to arrange one address event detection unit 400 for every N pixels. By sharing one address event detection unit 400 by N pixels in this manner, the circuit scale may be reduced as compared with the configuration in which the address event detection unit 400 is not shared but provided for each pixel.

[First Variation]

In the above-described first embodiment, the elements other than the photoelectric conversion element 333 are arranged on the detection chip 202, but in this configuration, there is a possibility that the circuit scale of the detection chip 202 increases as the number of pixels increases. A solid-state imaging element 200 in a first variation of the first embodiment is different from that in the first embodiment in that a circuit scale of a detection chip 202 is reduced.

Figure 12:
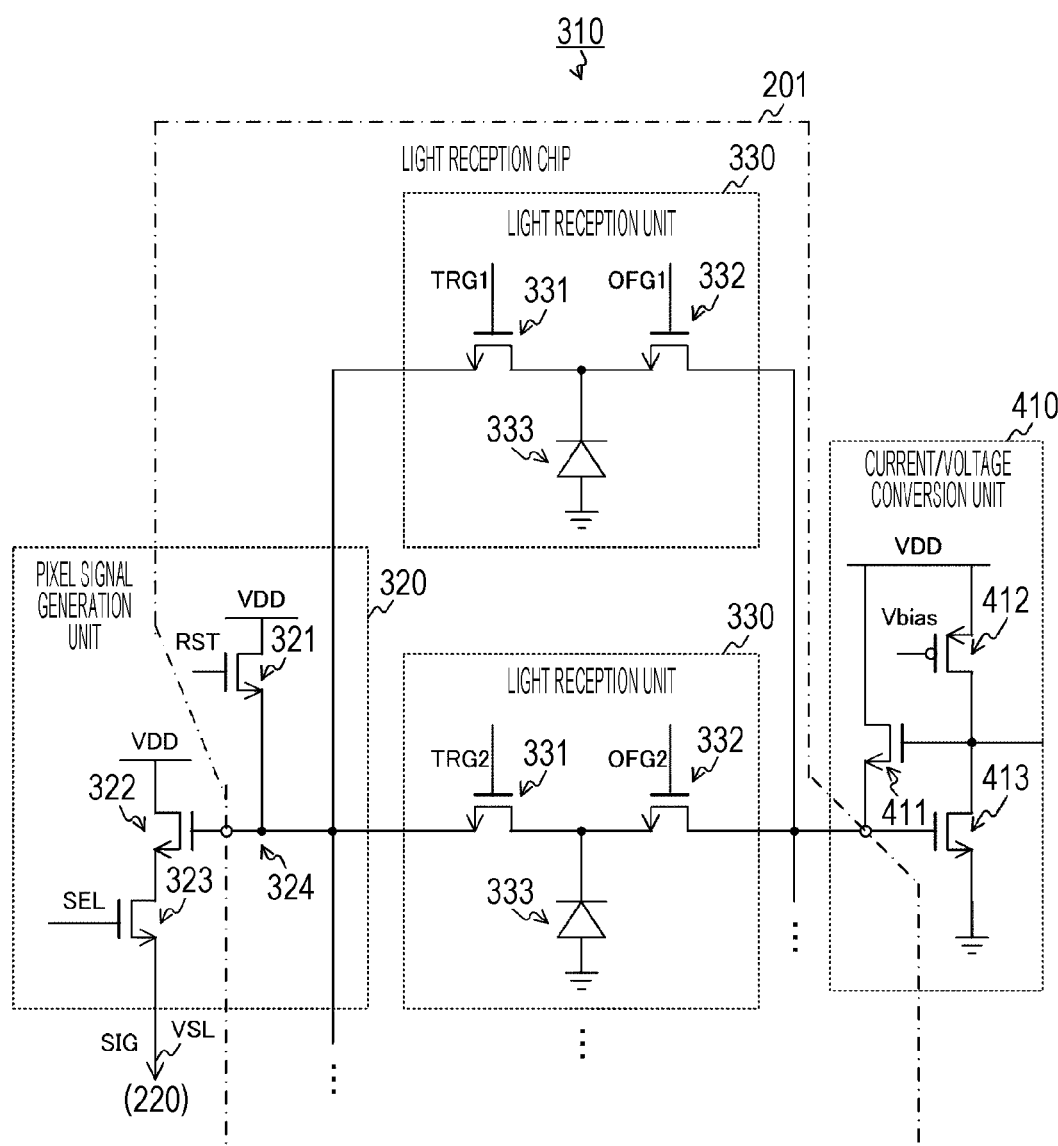
FIG. 12 is a circuit diagram illustrating a configuration example of a pixel block in a first variation of the first embodiment of the present technology.

FIG. 12 is a circuit diagram illustrating a configuration example of a pixel block 310 in the first variation of the first embodiment of the present technology. The pixel block 310 in the first variation of the first embodiment is different from that in the first embodiment in that a reset transistor 321, a floating diffusion layer 324, and a plurality of light reception units 330 are arranged on the light reception chip 201. Other elements are arranged on a detection chip 202.

In this manner, according to the first variation of the first embodiment of the present technology, since the reset transistor 321 and the like and a plurality of light reception units 330 are arranged on the light reception chip 201, the circuit scale of the detection chip 202 may be reduced as compared with that in the first embodiment.

[Second Variation]

In the first variation of the first embodiment described above, the reset transistor 321 and the like and the plurality of light reception units 330 are arranged on the light reception chip 201, but there is a possibility that the circuit scale of the detection chip 202 increases as the number of pixels increases. A solid-state imaging element 200 in a second variation of the first embodiment is different from that in the first variation of the first embodiment in that a circuit scale of a detection chip 202 is further reduced.

Figure 13:
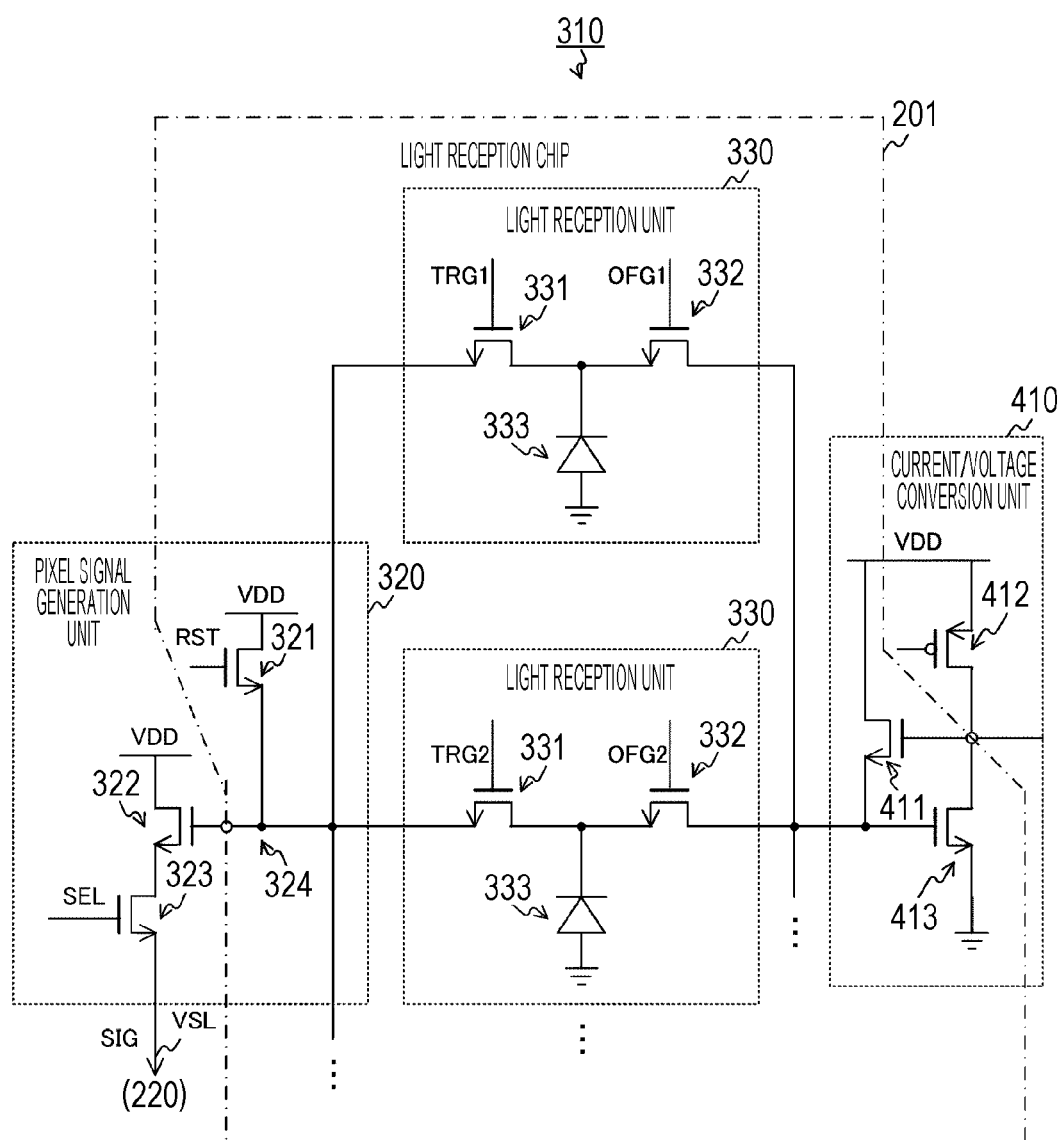
FIG. 13 is a circuit diagram illustrating a configuration example of a pixel block in a second variation of the first embodiment of the present technology.

FIG. 13 is a circuit diagram illustrating a configuration example of a pixel block 310 in the second variation of the first embodiment of the present technology. The pixel block 310 in the second variation of the first embodiment is different from that in the first variation of the first embodiment in that N-type transistors 411 and 413 are further arranged on a light reception chip 201. In this manner, by using only the N-type transistors in the light reception chip 201, the number of steps of forming the transistors may be reduced as compared with a case where the N-type transistor and a P-type transistor are mixed. Therefore, a manufacturing cost of the light reception chip 201 may be reduced.

In this manner, according to the second variation of the first embodiment of the present technology, since the N-type transistors 411 and 413 are further arranged on the light reception chip 201, the circuit scale of the detection chip 202 may be reduced as compared with that in the first variation of the first embodiment.

[Third Variation]

In the second variation of the first embodiment described above, the N-type transistors 411 and 413 are further arranged on the light reception chip 201, but there is a possibility that the circuit scale of the detection chip 202 increases as the number of pixels increases. A solid-state imaging element 200 in a third variation of the first embodiment is different from that in the second variation of the first embodiment in that a circuit scale of a detection chip 202 is further reduced.

Figure 14:
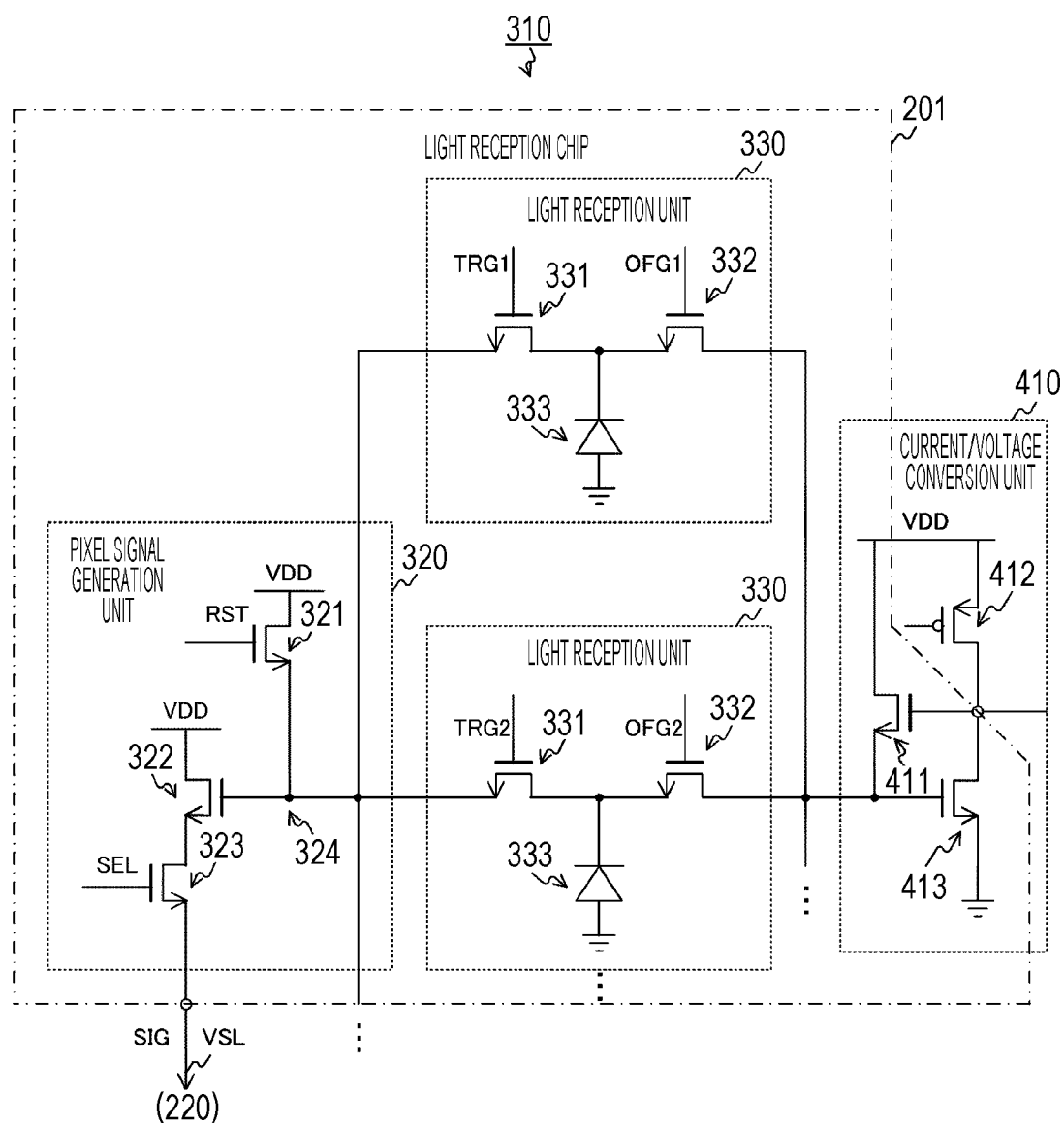
FIG. 14 is a circuit diagram illustrating a configuration example of a pixel block in a third variation of the first embodiment of the present technology.

FIG. 14 is a circuit diagram illustrating a configuration example of a pixel block 310 in the third variation of the first embodiment of the present technology. The pixel block 310 in the third variation of the first embodiment is different from that in the second variation of the first embodiment in that an amplification transistor 322 and a selection transistor 323 are further arranged on a light reception chip 201. That is, an entire pixel signal generation unit 320 is arranged on the light reception chip 201.

In this manner, according to the third variation of the first embodiment of the present technology, since the pixel signal generation unit 320 is arranged on the light reception chip 201, the circuit scale of the detection chip 202 may be reduced as compared with that in the second variation of the first embodiment.

2. Second Embodiment

Although the pixel signal generation unit 320 is provided for each pixel block 310 in the above-described first embodiment, there is a possibility that the circuit scale of the solid-state imaging element 200 increases as the number of pixels increases. A solid-state imaging element 200 in a second embodiment is different from that in the first embodiment in that pixel signal generation units 320 are reduced.

Figure 15:
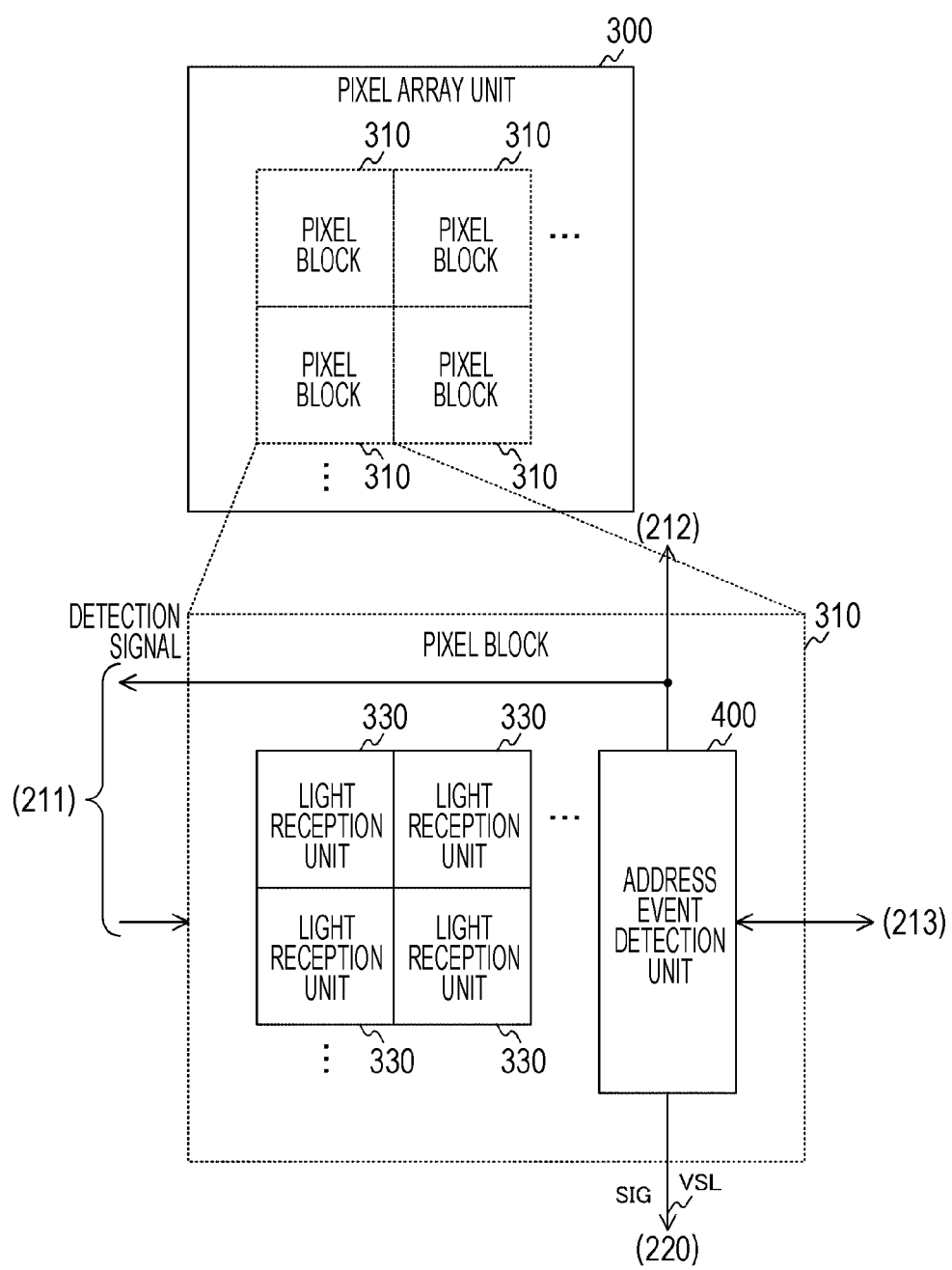
FIG. 15 is a block diagram illustrating a configuration example of a pixel array unit in a second embodiment of the present technology.

FIG. 15 is a block diagram illustrating a configuration example of a pixel array unit 300 in the second embodiment of the present technology. The pixel array unit 300 is different from that in the first embodiment in that the pixel signal generation unit 320 is not provided.

Furthermore, an address event detection unit 400 in the second embodiment is different from that in the first embodiment in generating a pixel signal SIG and outputting the same via a vertical signal line VSL.

Figure 16:
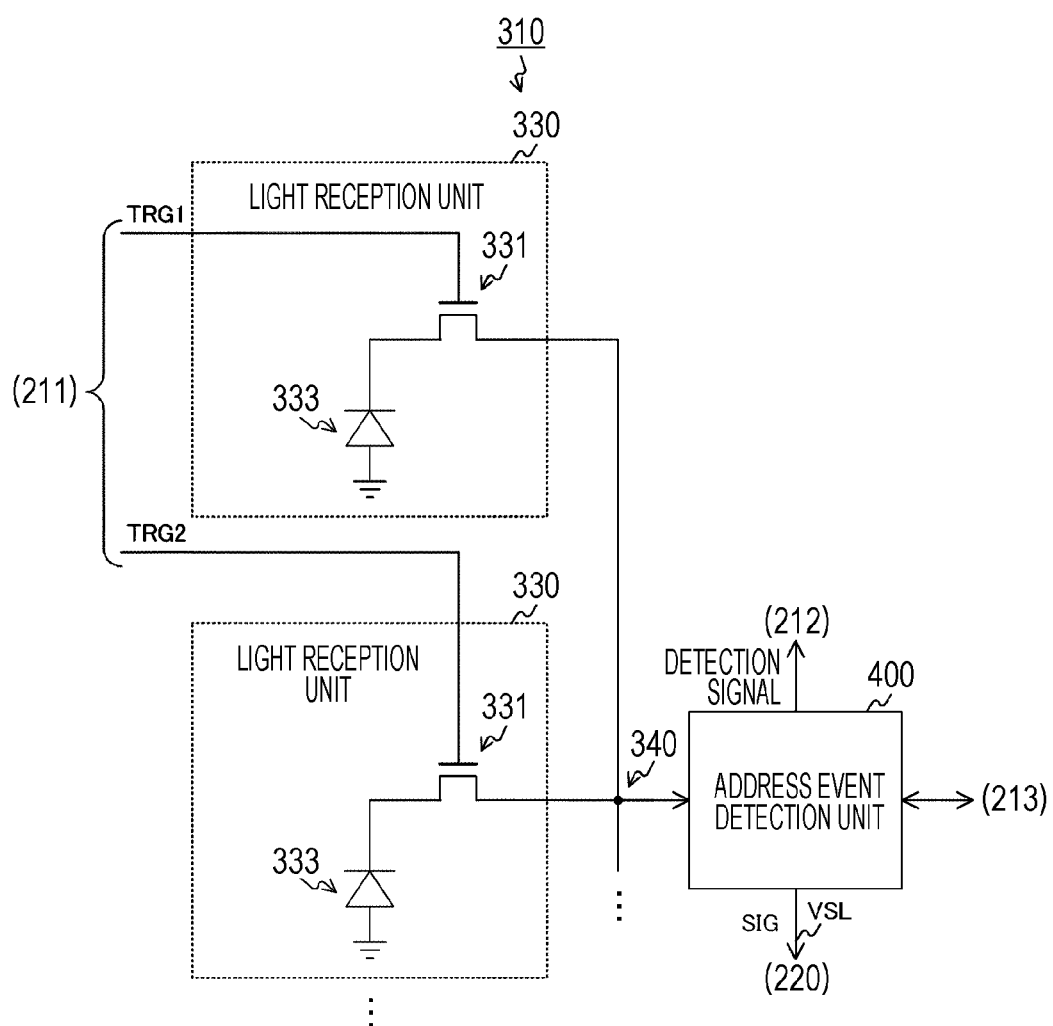
FIG. 16 is a circuit diagram illustrating a configuration example of a light reception unit in the second embodiment of the present technology.

FIG. 16 is a circuit diagram illustrating a configuration example of a light reception unit 330 in the second embodiment of the present technology. The light reception unit 330 in the second embodiment is different from that in the first embodiment in not including an OFG transistor 332.

Furthermore, a transfer transistor 331 in the second embodiment supplies a photocurrent from a photoelectric conversion element 333 to the address event detection unit 400 via a connection node 340.

Figure 17:
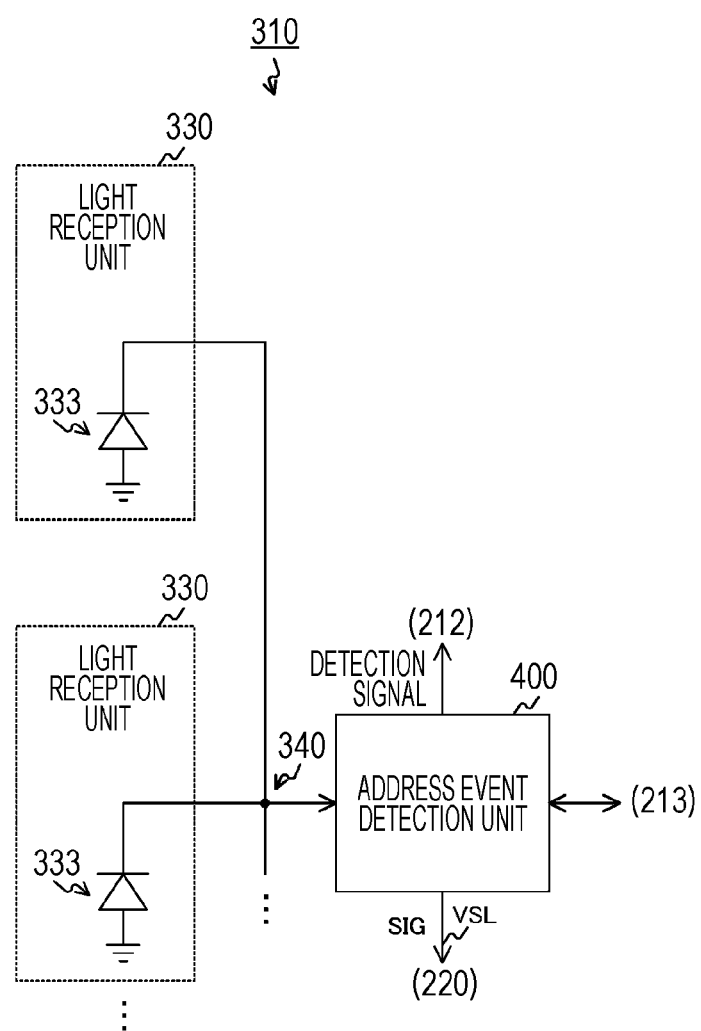
FIG. 17 is a circuit diagram illustrating a configuration example of a light reception unit in which a transfer transistor is reduced in the second embodiment of the present technology.

Note that, although the transfer transistor 331 is arranged on each of the light reception units 330, as illustrated in FIG. 17, it is also possible to adopt a configuration without the transistors provided. In this case, a drive circuit 211 does not need to supply a transfer signal TRGn to the light reception unit 330.

Figure 18:
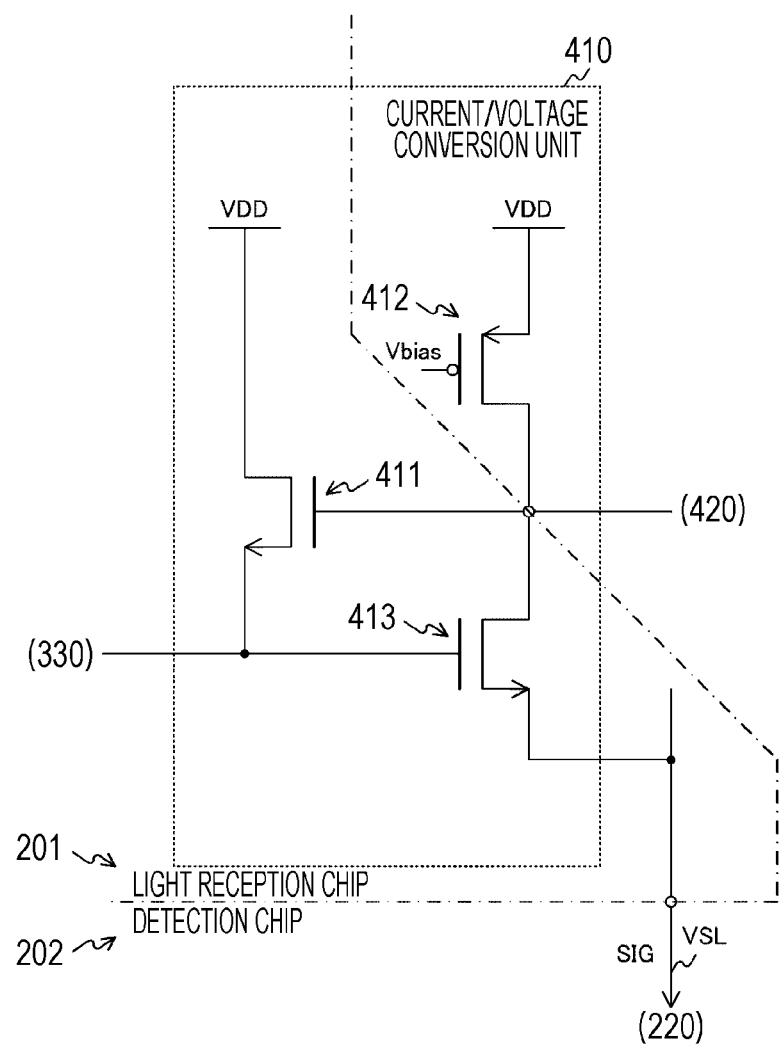
FIG. 18 is a circuit diagram illustrating a configuration example of a current/voltage conversion unit in the second embodiment of the present technology.

FIG. 18 is a circuit diagram illustrating a configuration example of a current/voltage conversion unit 410 in the second embodiment of the present technology. The current/voltage conversion unit 410 in the second embodiment is different from that in the first embodiment in that a source of an N-type transistor 413 is connected to the vertical signal line VSL.

Furthermore, when an address event is detected, the drive circuit 211 lowers a voltage (Vbias) to a gate of a P-type transistor 412 as compared with that before detection to a low level. Therefore, a voltage of a gate of an N-type transistor 411 reaches a power supply voltage VDD as that of a drain thereof, and the N-type transistor 411 is put into a state equivalent to a case of being diode-connected. Then, a pixel signal SIG of a voltage corresponding to the photocurrent is generated by the N-type transistor 413 that serves as a source follower.

Furthermore, a plurality of light reception units 330 and the N-type transistors 411 and 413 are arranged on a light reception chip 201, and remaining elements are arranged on a detection chip 202.

Figure 19:
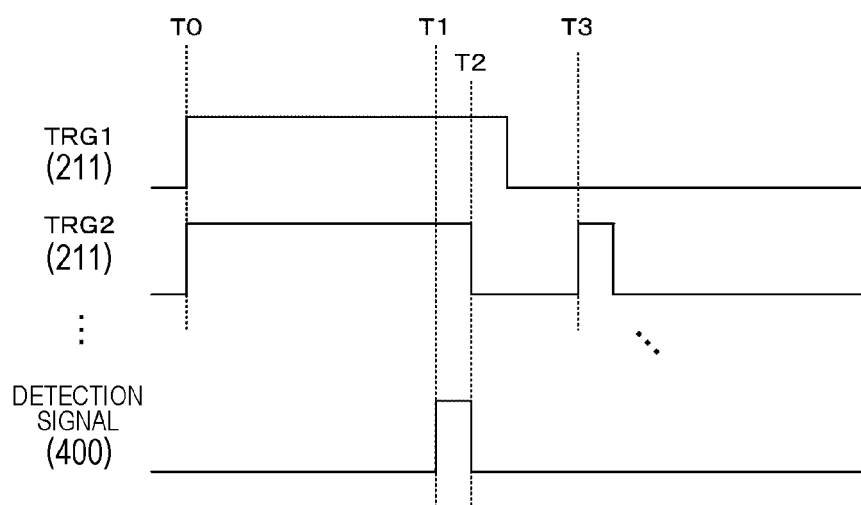
FIG. 19 is a timing chart illustrating an example of an operation of a solid-state imaging element in the second embodiment of the present technology.

FIG. 19 is a timing chart illustrating an example of an operation of the solid-state imaging element 200 in the second embodiment of the present technology.

At timing T0, when being instructed to start detecting the address event, the drive circuit 211 sets all transfer signals TRGn to a high level to turn on the transfer transistors 331 of all the pixels.

Then, suppose that the address event detection unit 400 detects the address event and outputs a high-level detection signal at timing T1.

Upon receiving the detection signal, the drive circuit 211 sets only a transfer signal TRG1 to a high level over a certain pulse period at timing T2. The pixel signal generation unit 320 converts a pixel signal of a first pixel into a digital signal.

At timing T3 after the conversion of the pixel signal, the drive circuit 211 sets a high-level transfer signal TRG2 to a high level over a certain pulse period. The pixel signal generation unit 320 converts a pixel signal of a second pixel into a digital signal. Thereafter, similar processing is executed, and the pixel signals of the respective pixels in the pixel block 310 are sequentially output.

When all the pixel signals are output, the drive circuit 211 sets all the transfer signals TRGn to the high level, and turns on the transfer transistors 331 of all the pixels.

In this manner, in the second embodiment of the present technology, the address event detection unit 400 generates the pixel signal SIG, so that it is not necessary to arrange the pixel signal generation unit 320. Therefore, a circuit scale may be reduced as compared with that in the first embodiment in which the pixel signal generation unit 320 is arranged.

[Variation]

In the above-described second embodiment, an entire ADC 230 is arranged on the detection chip 202; however, there is a possibility that the circuit scale of the detection chip 202 increases as the number of pixels increases. A solid-state imaging element 200 in a variation of the second embodiment is different from that in the second embodiment in that a part of an ADC 230 is arranged on a light reception chip 201 to reduce a circuit scale of a detection chip 202.

Figure 20:
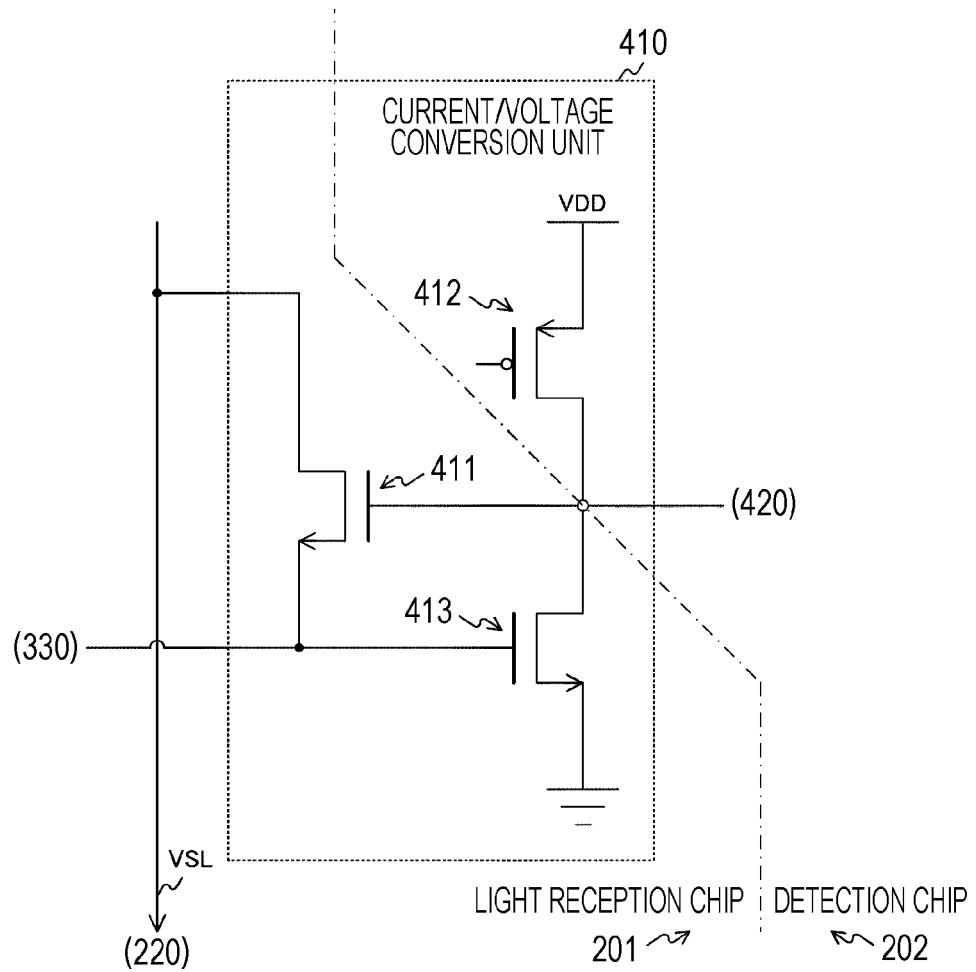
FIG. 20 is a circuit diagram illustrating a configuration example of a current/voltage conversion unit in a variation of the second embodiment of the present technology.

FIG. 20 is a circuit diagram illustrating a configuration example of a current/voltage conversion unit 410 in the variation of the second embodiment of the present technology. The current/voltage conversion unit 410 in the variation of the second embodiment is different from that in the second embodiment in that a source of an N-type transistor 413 is grounded and a drain of an N-type transistor 411 is connected to a vertical signal line VSL. Note that, as in the second embodiment, it is also possible to connect the source of the N-type transistor 413 to the vertical signal line VSL in place of the N-type transistor 411.

Figure 21:
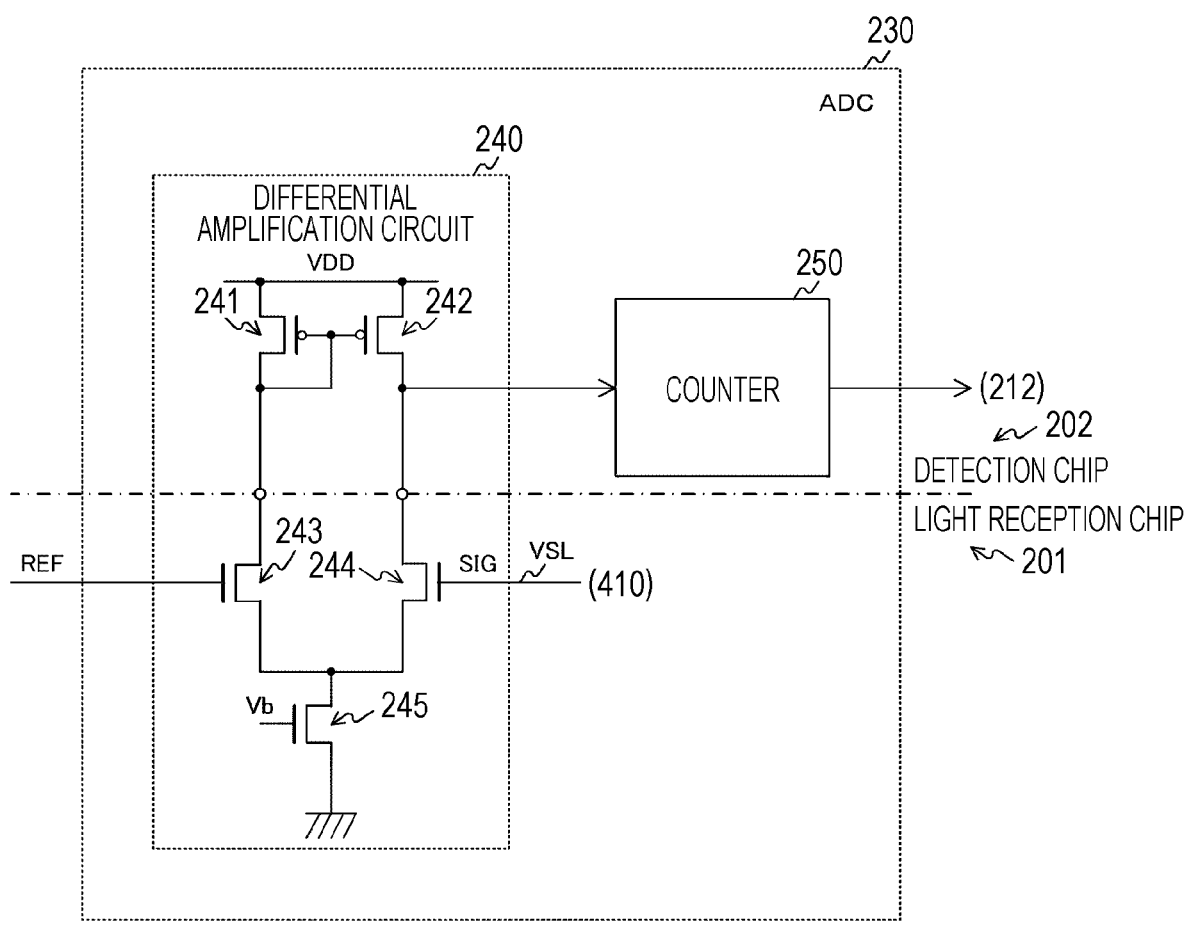
FIG. 21 is a circuit diagram illustrating a configuration example of an ADC in the variation of the second embodiment of the present technology.

FIG. 21 is a circuit diagram illustrating a configuration example of the ADC 230 in the variation of the second embodiment of the present technology. The ADC 230 is provided with a differential amplification circuit 240 and a counter 250.

The differential amplification circuit 240 is provided with N-type transistors 243, 244, and 245, and P-type transistors 241 and 242. For example, MOS transistors are used as these transistors.

The N-type transistors 243 and 244 form a differential pair, and sources of these transistors are commonly connected to a drain of the N-type transistor 245. Furthermore, a drain of the N-type transistor 243 is connected to a drain of the P-type transistor 241 and gates of the P-type transistors 241 and 242. A drain of the N-type transistor 244 is connected to a drain of the P-type transistor 242 and the counter 250. Furthermore, a reference signal REF is input to a gate of the N-type transistor 243, and a pixel signal SIG is input to a gate of the N-type transistor 244 via the vertical signal line VSL. Note that, the N-type transistor 243 is an example of a reference side transistor recited in claims, and the N-type transistor 244 is an example of a signal side transistor recited in claims.

For example, a ramp signal is used as the reference signal REF. A circuit that generates the reference signal REF is not illustrated.

A predetermined bias voltage Vb is applied to a gate of the N-type transistor 245 and a source thereof is grounded. This N-type transistor 245 supplies a constant current. Note that, the N-type transistor 245 is an example of a constant current source recited in claims.

With the above-described configuration, the P-type transistors 241 and 242 form a current mirror circuit, amplify a difference between the reference signal REF and the pixel signal SIG, and output the same to the counter 250. Then, the counter 250 counts a count value over a period until a signal from the differential amplification circuit 240 is inverted, and outputs a digital signal indicating the count value to the signal processing unit 212.

Furthermore, in the variation of the second embodiment described above, the light reception chip 201 is further provided with the above-described N-type transistors 243, 244, and 245.

In this manner, according to the variation of the second embodiment of the present technology, since the N-type transistors 243, 244, and 245 are further arranged on the light reception chip 201, the circuit scale of the detection chip 202 may be reduced as compared with that in the second embodiment.

3. Third Embodiment

In the above-described second embodiment, the capacitors 431 and 433 are arranged in the address event detection unit 400; however, the gain is deteriorated when the capacitance C1 is reduced according to expression 5, so that it is difficult to improve an operation speed of the circuit by reducing the capacitance C1. A solid-state imaging element 200 according to a third embodiment is different from that in the second embodiment in that a capacitor 431 is arranged for each pixel to improve an operation speed.

Figure 22:
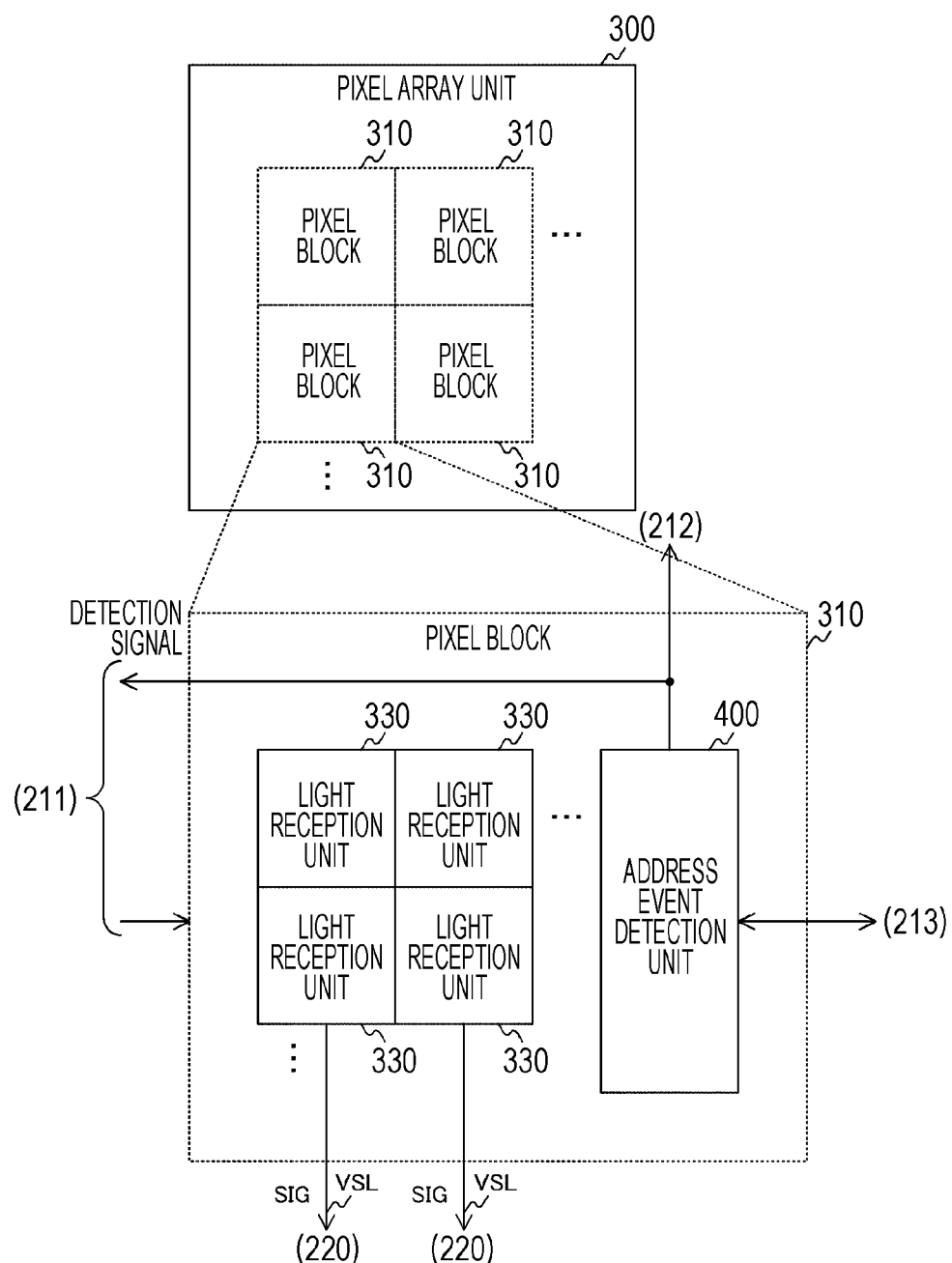
FIG. 22 is a block diagram illustrating a configuration example of a pixel array unit in a third embodiment of the present technology.

FIG. 22 is a block diagram illustrating a configuration example of a pixel array unit 300 in the third embodiment of the present technology. The pixel array unit 300 in the third embodiment is different from that in the second embodiment in that each of light reception units 330 generates a pixel signal SIG in place of an address event detection unit 400. Furthermore, a vertical signal line VSL is wired for each column of pixels, for example. Then, an ADC 230 is also provided for each pixel column. Note that, as in the second embodiment, the vertical signal line VSL may be arranged for each column of pixel blocks 310 and each of the light reception units 330 may be connected thereto. In this case, the ADC 230 is also provided for each column of the pixel blocks 310.

Figure 23:
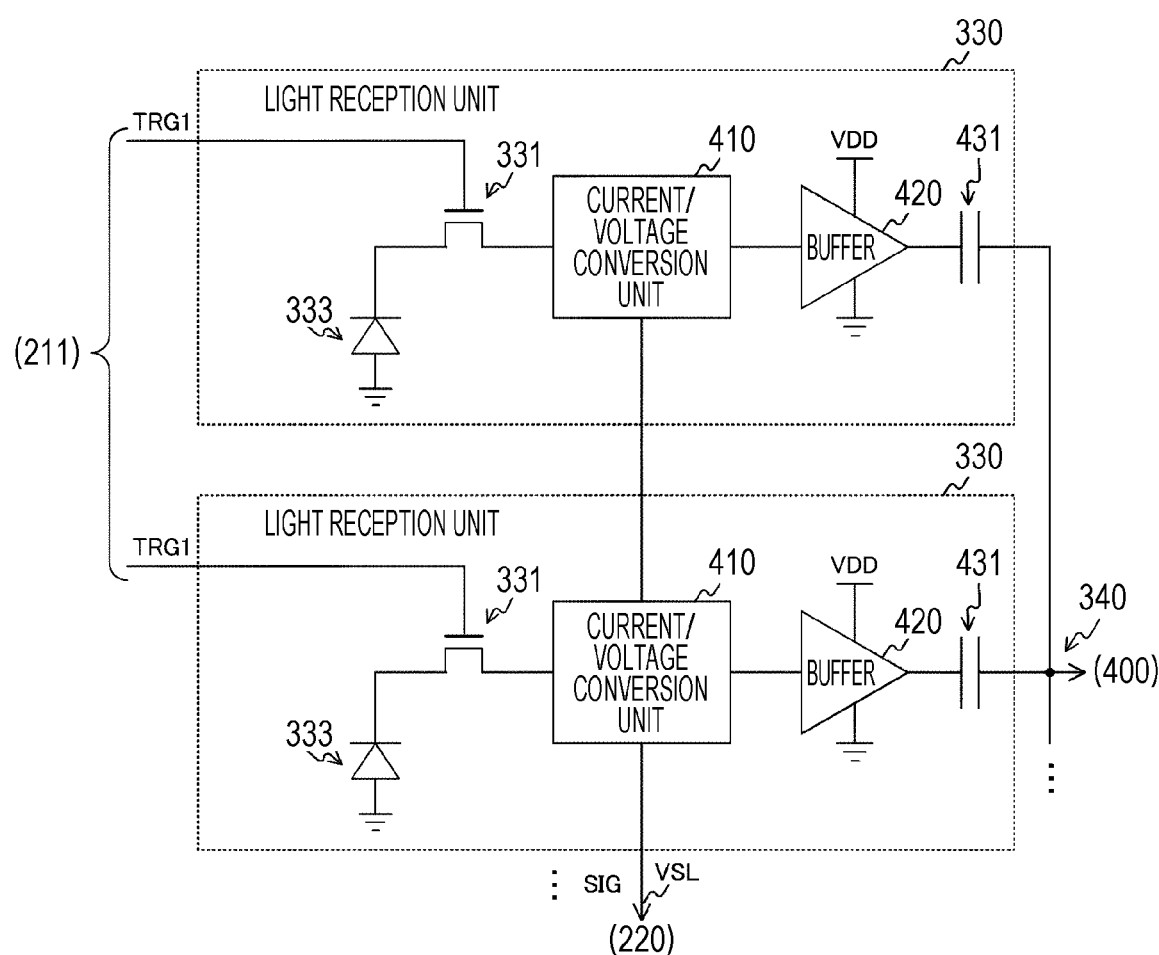
FIG. 23 is a circuit diagram illustrating a configuration example of a light reception unit in the third embodiment of the present technology.

FIG. 23 is a circuit diagram illustrating a configuration example of the light reception unit 330 in the third embodiment of the present technology. The light reception unit 330 in the third embodiment is different from that in the second embodiment in further including a current/voltage conversion unit 410, a buffer 420, and a capacitor 431.

A circuit configuration of the current/voltage conversion unit 410 in the third embodiment is similar to that in the variation of the second embodiment illustrated in FIG. 19, for example. Furthermore, an operation of a drive circuit 211 in the third embodiment is similar to that in the second embodiment. Furthermore, circuits and elements arranged on a light reception chip 201 and a detection chip 202 in the third embodiment are similar to those in the variation of the second embodiment. That is, as illustrated in FIG. 20, in the current/voltage conversion unit 410, N-type transistors 411 and 413 are arranged on the light reception chip 201. Furthermore, as illustrated in FIG. 21, in the ADC 230, N-type transistors 243, 244, and 245 are arranged on the light reception chip 201.

Figure 24:
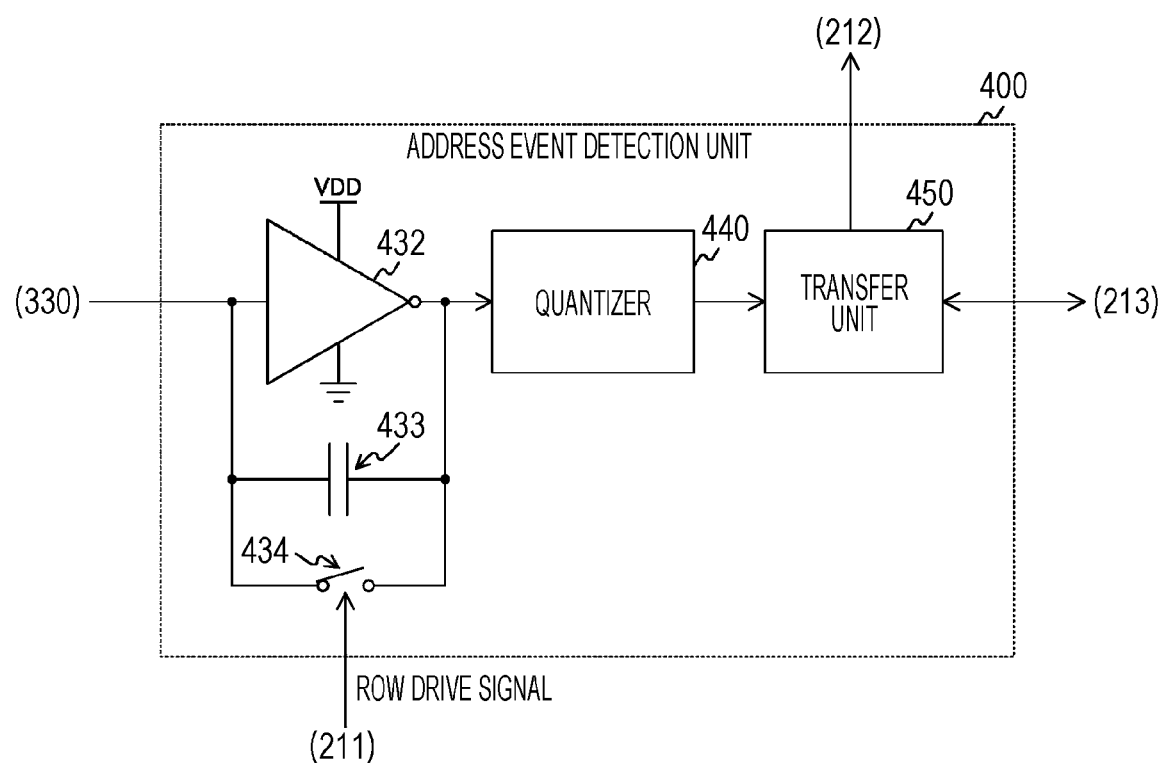
FIG. 24 is a block diagram illustrating a configuration example of an address event detection unit in the third embodiment of the present technology.

FIG. 24 is a block diagram illustrating a configuration example of the address event detection unit 400 in the third embodiment of the present technology. The address event detection unit 400 in the third embodiment is different from that in the second embodiment in not including the current/voltage conversion unit 410, the buffer 420, and the capacitor 431.

As described above, in the third embodiment, unlike the second embodiment in which a plurality of light reception units 330 connected in parallel shares one capacitor 431, the capacitor 431 is provided for each light reception unit 330. For this reason, individual capacitance of the capacitor 431 may be (C1)/N when the number of light reception units 330 (that is, the number of pixels) is set to N. By this reduction in capacitance, the operating speed of the circuit may be improved. However, an overall gain A in the third embodiment is expressed by a following expression.

[Mathematical Expression 2]

[Mathematical Expression 2]

$$A = \frac{CG_{log} \cdot C1}{N \cdot C2} \sum_{n=1}^{N} i_{photo\_n} \qquad \text{Expression 7}$$

From Expressions 6 and 7, the gain A in the third embodiment is smaller than that in the first and second embodiments. For this reason, in exchange for improvement in operation speed, detection accuracy of the address event decreases.

In this manner, according to the third embodiment of the present technology, since the capacitor 431 is arranged for each of the light reception units 330, it is possible to improve the operation speed of the circuit including the capacitor 431 as compared with a case where a plurality of light reception units 330 shares the capacitor 431.

[Variation]

In the above-described third embodiment, the plurality of light reception units 330 (pixels) in the column shares one ADC 230, but since it is required to sequentially convert the pixel signals of those pixels into digital signals, a read speed of the pixel signals decreases as the number of pixels in the column increases. A solid-state imaging element 200 in a variation of the third embodiment is different from that in the third embodiment in that an ADC 230 is arranged for each pixel.

Figure 25:
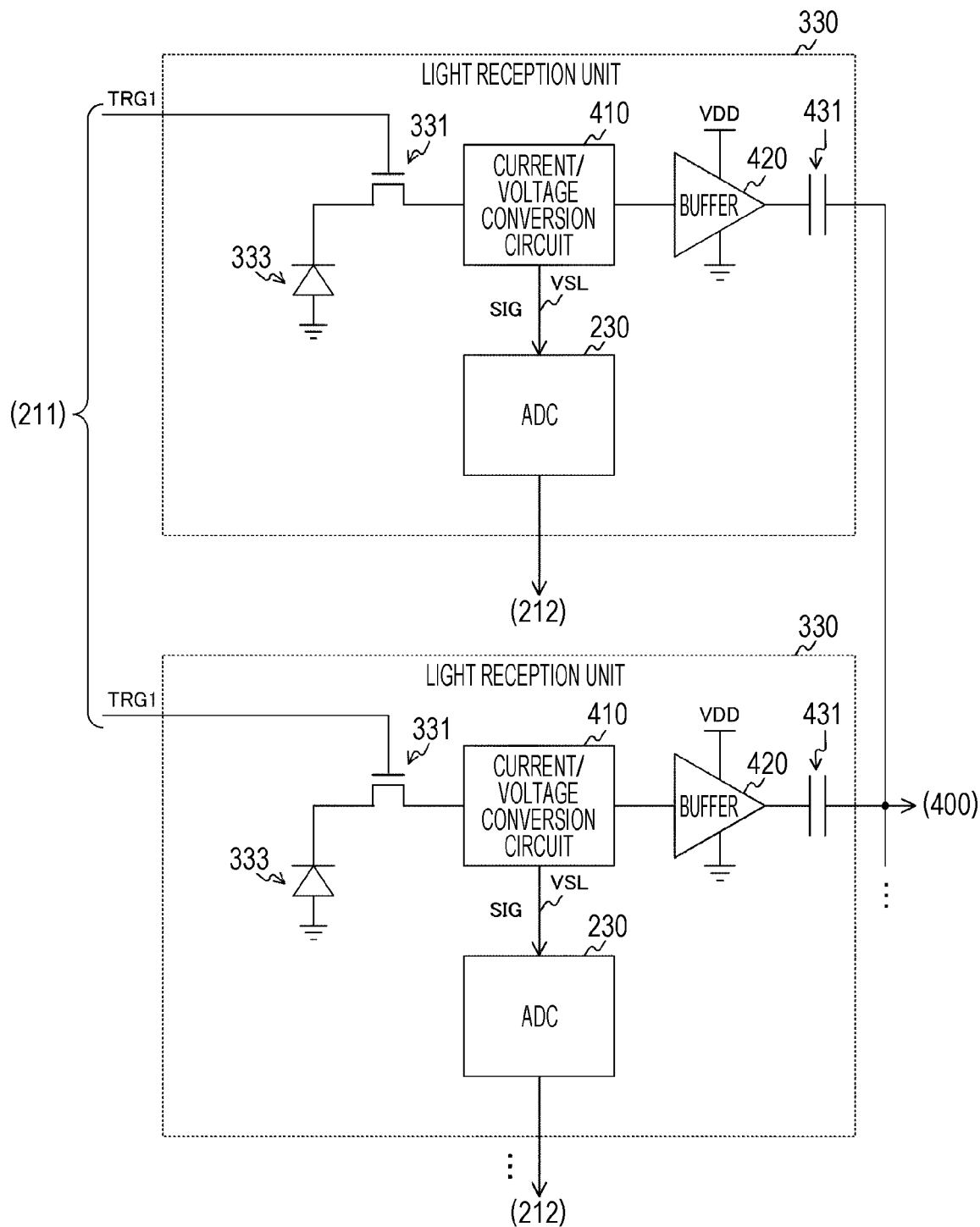
FIG. 25 is a circuit diagram illustrating a configuration example of a light reception unit in a variation of the third embodiment of the present technology.

FIG. 25 is a circuit diagram illustrating a configuration example of a light reception unit 330 in the variation of the third embodiment of the present technology. The light reception unit 330 in the variation of the third embodiment is different from that in the third embodiment in further including the ADC 230.

In this manner, according to the variation of the third embodiment of the present technology, since the ADC 230 is arranged for each of the light reception units 330, it is possible to improve a read speed of a pixel signal as compared with a configuration in which a plurality of light reception units 330 shares one ADC 230.

4. Fourth Embodiment

In the above-described first embodiment, the address event is detected for each pixel block 310 including a plurality of pixels, but it is not possible to detect the address event occurring in each pixel. A solid-state imaging element 200 in a fourth embodiment is different from that in the first embodiment in that an address event detection unit 400 is arranged for each pixel.

Figure 26:
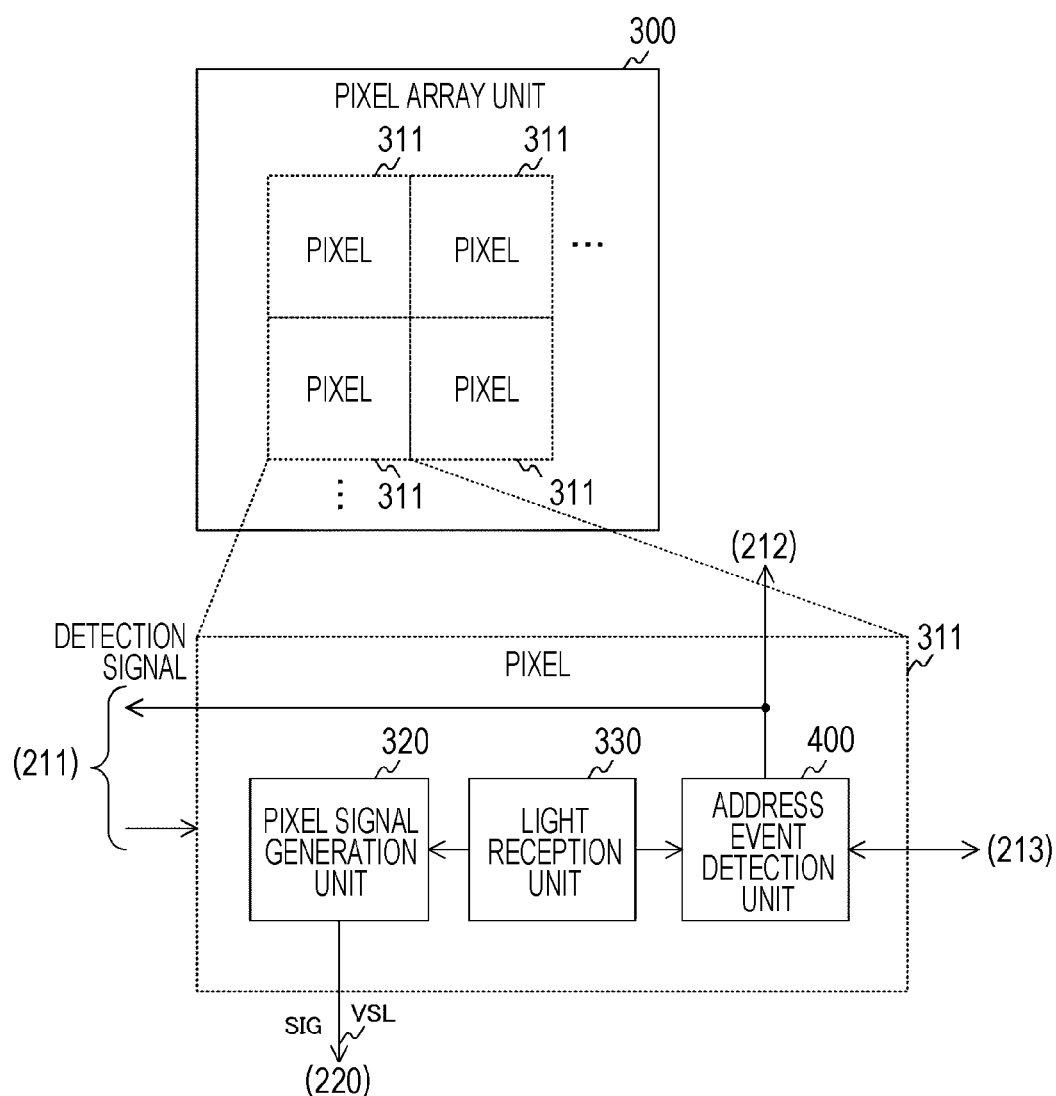
FIG. 26 is a block diagram illustrating a configuration example of a pixel array unit in a fourth embodiment of the present technology.

FIG. 26 is a block diagram illustrating a configuration example of a pixel array unit 300 in the fourth embodiment of the present technology. The pixel array unit 300 in the fourth embodiment is different from that in the first embodiment in that a plurality of pixels 311 is arranged in a two-dimensional lattice manner. A pixel signal generation unit 320, a light reception unit 330, and the address event detection unit 400 are arranged in each of the pixels 311. Circuit configurations of the pixel signal generation unit 320, the light reception unit 330, and the address event detection unit 400 are similar to those in the first embodiment.

Furthermore, circuits and elements arranged in the light reception chip 201 and the detection chip 202 are similar to those in any of the first embodiment and the first, second, and third variations of the first embodiment. For example, as illustrated in FIG. 5, only a photoelectric conversion element 333 is arranged on a light reception chip 201, and remaining elements are arranged on a detection chip 202.

In this manner, according to the fourth embodiment of the present technology, since the address event detection unit 400 is arranged for each pixel, the address event may be detected for each pixel. Therefore, resolution of detection data of the address event may be improved as compared with a case where the address event is detected for each pixel block 310.

[Variation]

Although the address event detection unit 400 is arranged in all the pixels in the above-described fourth embodiment, it is possible that the circuit scale of the solid-state imaging element 200 increases as the number of pixels increases. A solid-state imaging element 200 in a variation of the fourth embodiment is different from that in the fourth embodiment in that an address event detection unit 400 is arranged only in a pixel being a detection target out of a plurality of pixels.

Figure 27:
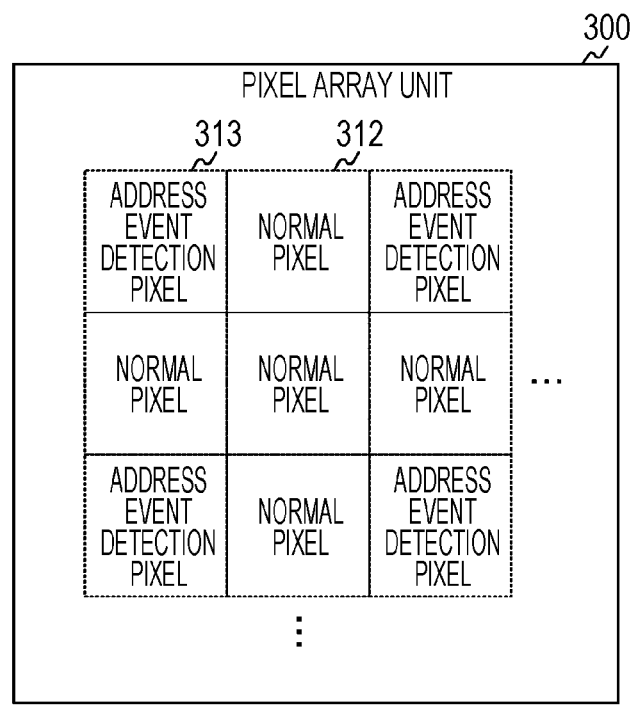
FIG. 27 is a block diagram illustrating a configuration example of a pixel array unit in a variation of the fourth embodiment of the present technology.

FIG. 27 is a block diagram illustrating a configuration example of a pixel array unit 300 in the variation of the fourth embodiment of the present technology. The pixel array unit 300 in the variation of the fourth embodiment is different from that in the fourth embodiment in that a pixel in which the address event detection unit 400 is not arranged and a pixel in which the address event detection unit 400 is arranged are arranged. The former is a normal pixel 312 and the latter is an address event detection pixel 313. The address event detection pixels 313 are arranged at regular intervals, for example. Note that, a plurality of address event detection pixels 313 may be arranged so as to be adjacent to each other.

Furthermore, a configuration of the address event detection pixel 313 is similar to that of the pixel 311 in the fourth embodiment. The normal pixel 312 is described later in detail.

Figure 28:
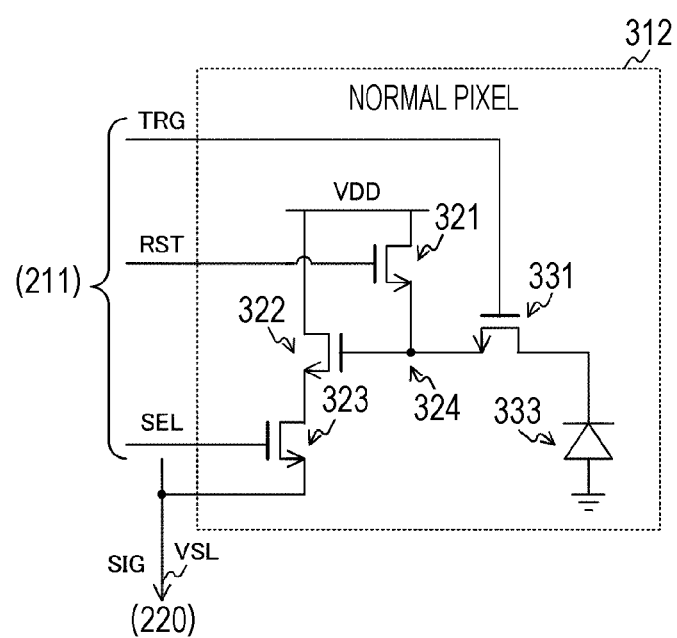
FIG. 28 is a circuit diagram illustrating a configuration example of a normal pixel in a variation of the fourth embodiment of the present technology.

FIG. 28 is a circuit diagram illustrating a configuration example of the normal pixel 312 in the variation of the fourth embodiment of the present technology. The normal pixel 312 in the variation of the fourth embodiment is provided with a photoelectric conversion element 333, a transfer transistor 331, a reset transistor 321, an amplification transistor 322, a selection transistor 323, and a floating diffusion layer 324. A connection configuration of these elements is similar to that in the first embodiment illustrated in FIG. 5.

In this manner, according to the variation of the fourth embodiment of the present technology, since the address event detection unit 400 is arranged only in the address event detection pixel 313 among all the pixels, a circuit scale may be reduced as compared with the configuration in which the address event detection unit 400 is arranged in all the pixels.

5. Fifth Embodiment

In the first embodiment described above, the number of pixels sharing the address event detection unit 400 and the number of pixels sharing the image signal generation unit 320 are made the same, but the latter may be reduced. A solid-state imaging element 200 in a fifth embodiment is different from that in the first embodiment in that the number of pixels sharing an image signal generation unit 320 is smaller than the number of pixels sharing an address event detection unit 400.

Figure 29:
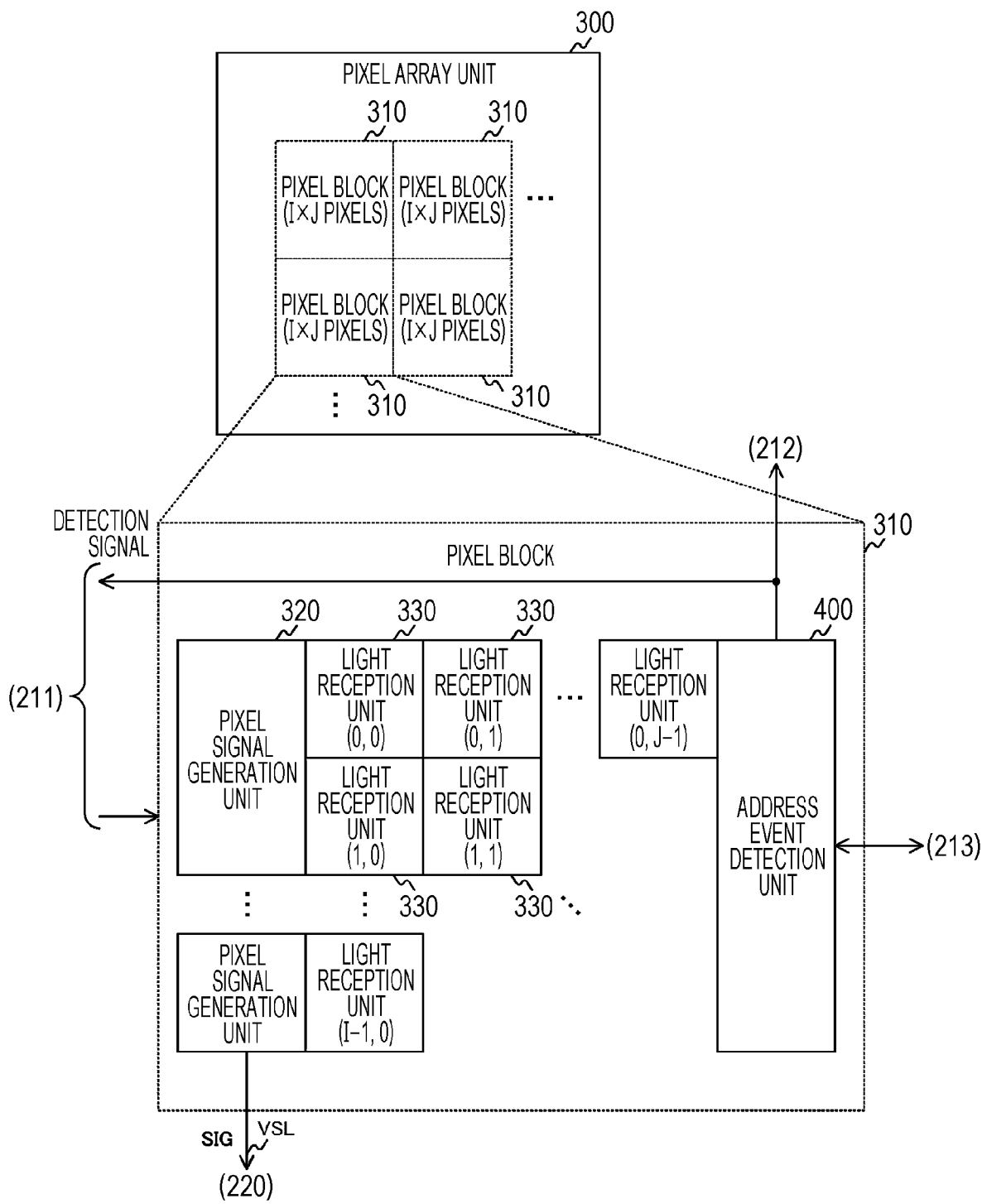
FIG. 29 is a block diagram illustrating a configuration example of a pixel array unit in a fifth embodiment of the present technology.

FIG. 29 is a block diagram illustrating a configuration example of a pixel array unit 300 in the fifth embodiment of the present technology. In the pixel array unit 300 in the fifth embodiment, N light reception units 330 (pixels) and one address event detection unit 400 are arranged in each of pixel blocks 310. Furthermore, in each of the pixel blocks 310, the pixel signal generation unit 320 is arranged for every M (M is an integer smaller than N) light reception units 330 (pixels).

Figure 30:
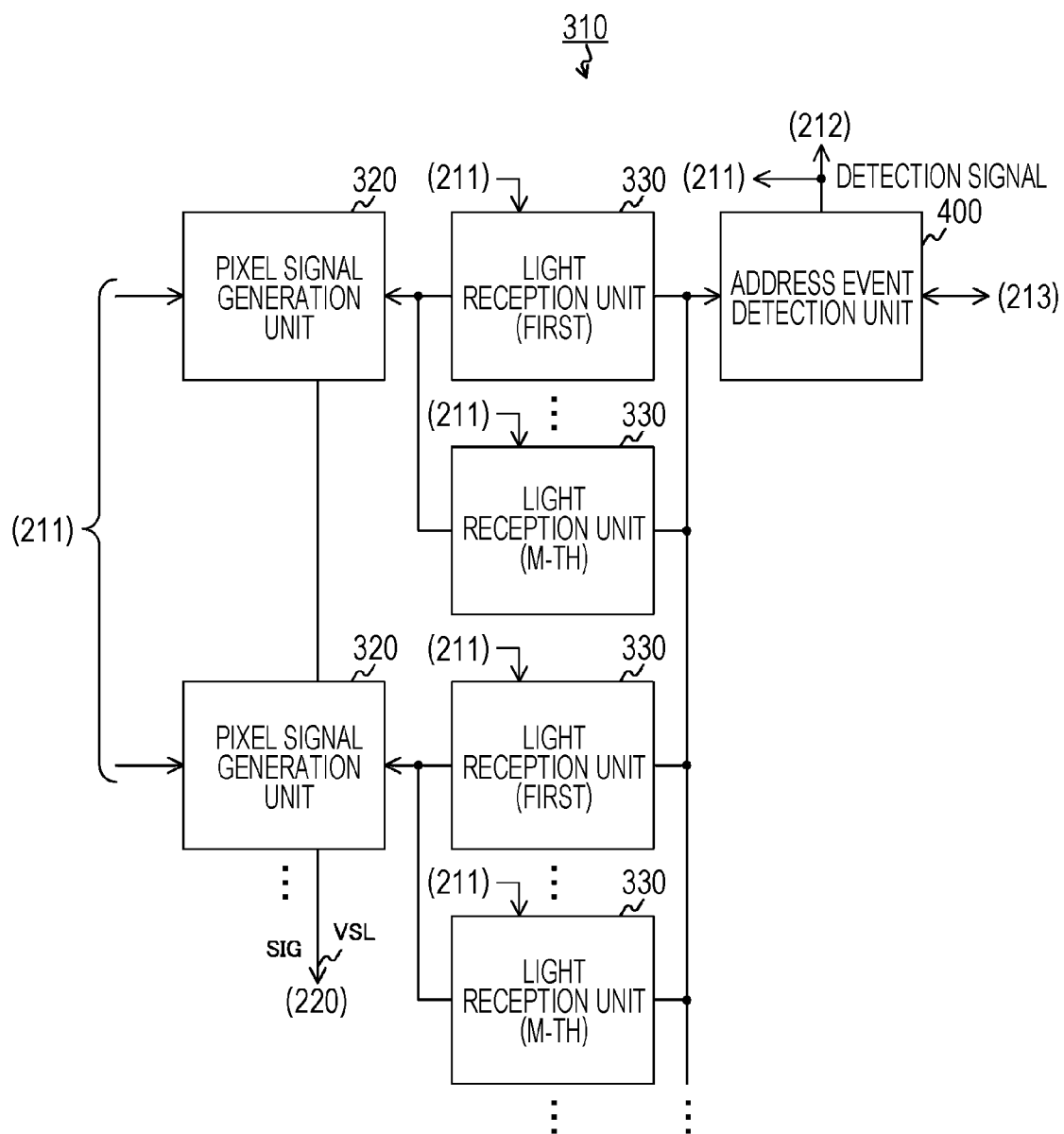
FIG. 30 is a block diagram illustrating a configuration example of a pixel block in the fifth embodiment of the present technology.

FIG. 30 is a block diagram illustrating a configuration example of the pixel block 310 in the fifth embodiment of the present technology. In each of the pixel blocks 310, the N light reception units 330 (pixels) share one address event detection unit 400. Furthermore, the M pixels share one image signal generation unit 320. The image signal generation unit 320 generates the pixel signal of a selected pixel out of the corresponding M pixels.

In this manner, according to the fifth embodiment of the present technology, the number of pixels sharing the image signal generation unit 320 is made smaller than the number of pixels sharing the address event detection unit 400, so that it is possible to improve a read speed of a pixel signal as compared with a case where they made the same.

6. Sixth Embodiment

In the first embodiment described above, a plurality of pixels shares the image signal generation unit 320 and the address event detection unit 400; however, it is also possible to arrange the address event detection unit 400 for each pixel. A solid-state imaging element 200 in a sixth embodiment is different from that in the first embodiment in that an address event detection unit 400 is arranged for each pixel while a plurality of pixels shares an image signal generation unit 320.

Figure 31:
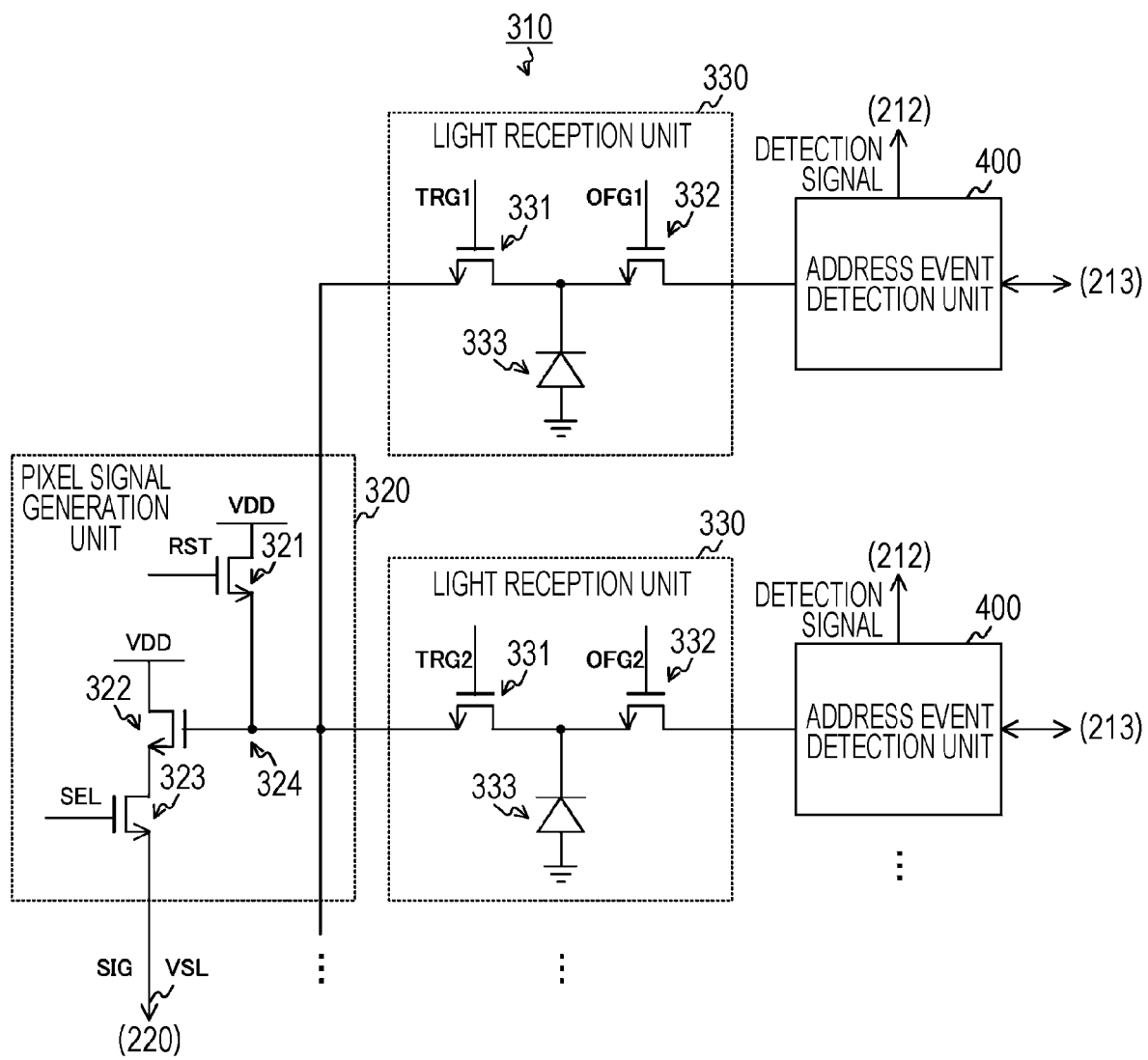
FIG. 31 is a block diagram illustrating a configuration example of a pixel block in a sixth embodiment of the present technology.

FIG. 31 is a block diagram illustrating a configuration example of a pixel block 310 in the sixth embodiment of the present technology. In each of the pixel blocks 310, the N light reception units 330 (pixels) share one pixel signal generation unit 320. On the other hand, the address event detection unit 400 is arranged for each light reception unit 330 (pixel), and the light reception unit 330 is connected to a corresponding address event detection unit 400.

In this manner, according to the sixth embodiment of the present technology, since the address event detection unit 400 is arranged for each pixel, presence/absence of an address event may be detected for each pixel.

7. Application Example to Mobile Body

The technology according to the present disclosure (present technology) is applicable to various products. For example, the technology according to the present disclosure may also be realized as a device mounted on any type of mobile body such as an automobile, an electric automobile, a hybrid electric automobile, a motorcycle, a bicycle, a personal mobility, an airplane, a drone, a ship, and a robot.

Figure 32:
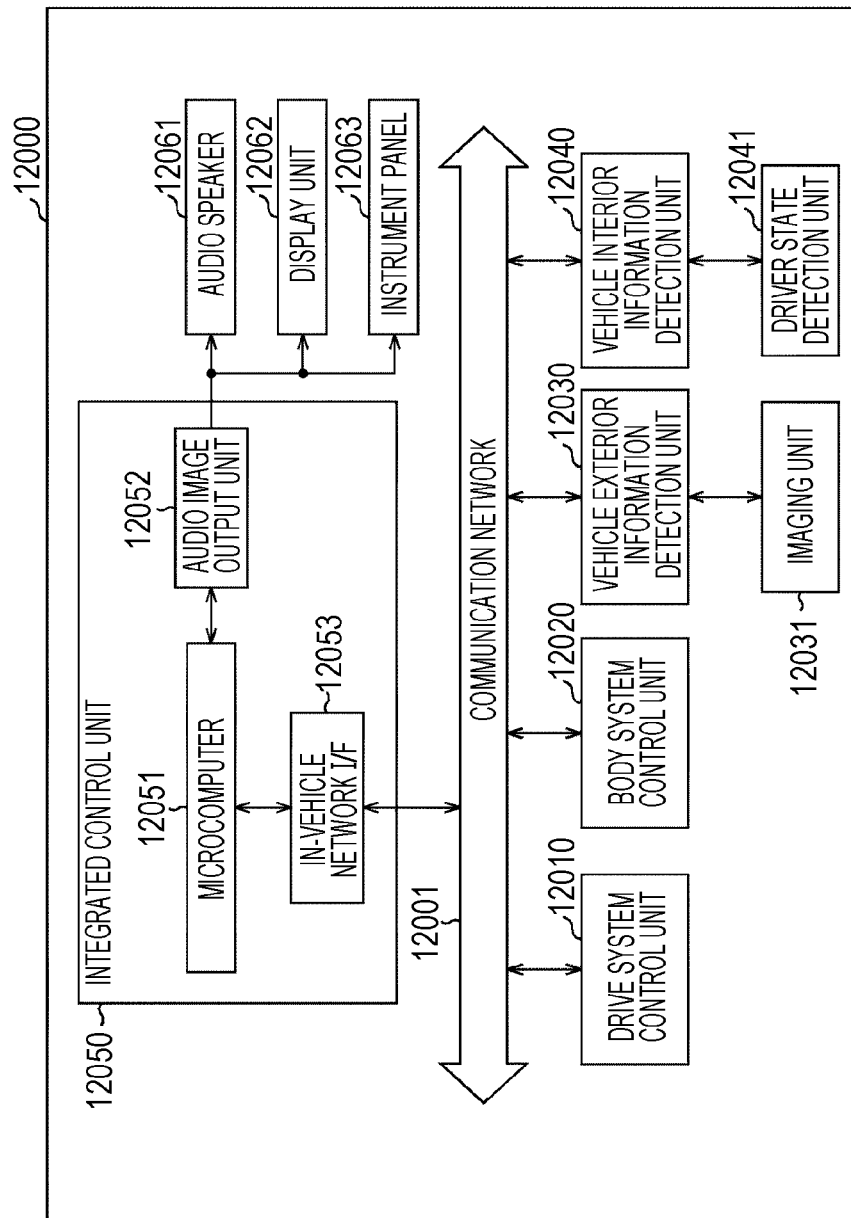
FIG. 32 is a block diagram illustrating a schematic configuration example of a vehicle control system.

FIG. 32 is a block diagram illustrating a schematic configuration example of a vehicle control system that is an example of a mobile body control system to which the technology according to the present disclosure may be applied.

A vehicle control system 12000 is provided with a plurality of electronic control units connected to one another via a communication network 12001. In the example illustrated in FIG. 32, the vehicle control system 12000 is provided with a drive system control unit 12010, a body system control unit 12020, a vehicle exterior information detection unit 12030, a vehicle interior information detection unit 12040, and an integrated control unit 12050. Furthermore, a microcomputer 12051, an audio image output unit 12052, and an in-vehicle network interface (I/F) 12053 are illustrated as functional configurations of the integrated control unit 12050.

The drive system control unit 12010 controls operation of devices related to a drive system of a vehicle according to various programs. For example, the drive system control unit 12010 serves as a control device of a driving force generating device for generating driving force of the vehicle such as an internal combustion engine or a driving motor, a driving force transmitting mechanism for transmitting the driving force to wheels, a steering mechanism for adjusting a rudder angle of the vehicle, a braking device for generating braking force of the vehicle and the like.

The body system control unit 12020 controls operation of various devices mounted on a vehicle body in accordance with the various programs. For example, the body system control unit 12020 serves as a control device of a keyless entry system, a smart key system, a power window device, or various lights such as a head light, a backing light, a brake light, a blinker, or a fog light. In this case, a radio wave transmitted from a portable device that substitutes for a key or signals of various switches may be input to the body system control unit 12020. The body system control unit 12020 receives an input of the radio wave or signals and controls a door lock device, a power window device, the lights and the like of the vehicle.

The vehicle exterior information detection unit 12030 detects information outside the vehicle on which the vehicle control system 12000 is mounted. For example, an imaging unit 12031 is connected to the vehicle exterior information detection unit 12030. The vehicle exterior information detection unit 12030 allows the imaging unit 12031 to take an image of the exterior of the vehicle and receives the taken image. The vehicle exterior information detection unit 12030 may perform detection processing of objects such as a person, a vehicle, an obstacle, a sign, or a character on a road surface or distance detection processing on the basis of the received image.

The imaging unit 12031 is an optical sensor that receives light and outputs an electric signal corresponding to an amount of the received light. The imaging unit 12031 may output the electric signal as the image or output the same as ranging information. Furthermore, the light received by the imaging unit 12031 may be visible light or invisible light such as infrared light.

The vehicle interior information detection unit 12040 detects information in the vehicle. The vehicle interior information detection unit 12040 is connected to, for example, a driver state detection unit 12041 for detecting a state of a driver. The driver state detection unit 12041 includes, for example, a camera that images the driver, and the vehicle interior information detection unit 12040 may calculate a driver's fatigue level or concentration level or may determine whether or not the driver is dozing on the basis of detection information input from the driver state detection unit 12041.

The microcomputer 12051 may calculate a control target value of the driving force generating device, the steering mechanism, or the braking device on the basis of the information inside and outside the vehicle obtained by the vehicle exterior information detection unit 12030 or the vehicle interior information detection unit 12040, and output a control instruction to the drive system control unit 12010. For example, the microcomputer 12051 may perform cooperative control for realizing functions of advanced driver assistance system (ADAS) including collision avoidance or impact attenuation of the vehicle, following travel based on the distance between the vehicles, vehicle speed maintaining travel, vehicle collision warning, vehicle lane departure warning and the like.

Furthermore, the microcomputer 12051 may perform the cooperative control for realizing automatic driving and the like to autonomously travel independent from the operation of the driver by controlling the driving force generating device, the steering mechanism, the braking device and the like on the basis of the information around the vehicle obtained by the vehicle exterior information detection unit 12030 or the vehicle interior information detection unit 12040.

Furthermore, the microcomputer 12051 may output the control instruction to the body system control unit 12020 on the basis of the information outside the vehicle obtained by the vehicle exterior information detection unit 12030. For example, the microcomputer 12051 may perform the cooperative control to realize glare protection such as controlling the head light according to a position of a preceding vehicle or an oncoming vehicle detected by the vehicle exterior information detection unit 12030 to switch a high beam to a low beam.

The audio image output unit 12052 transmits at least one of audio or image output signal to an output device capable of visually or audibly notifying an occupant of the vehicle or the outside the vehicle of the information. In the example in FIG. 32, as the output device, an audio speaker 12061, a display unit 12062, and an instrument panel 12063 are illustrated. The display unit 12062 may include at least one of an on-board display or a head-up display, for example.

Figure 33:
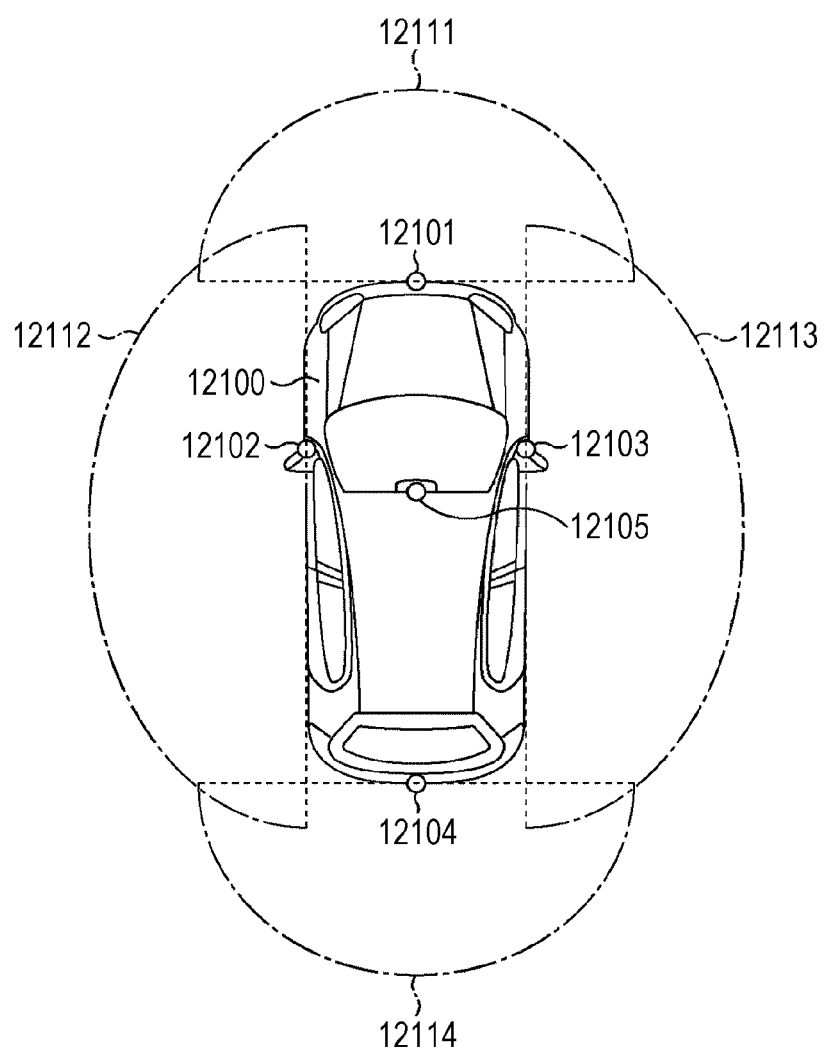
FIG. 33 is an explanatory view illustrating an example of an installation position of an imaging unit.

FIG. 33 is a view illustrating an example of an installation position of the imaging unit 12031.

In FIG. 33, imaging units 12101, 12102, 12103, 12104, and 12105 are included as the imaging unit 12031.

The imaging units 12101, 12102, 12103, 12104, and 12105 are provided in positions such as, for example, a front nose, a side mirror, a rear bumper, a rear door, and an upper portion of a front windshield in a vehicle interior of the vehicle 12100. The imaging unit 12101 provided on the front nose and the imaging unit 12105 provided in the upper portion of the front windshield in the vehicle interior principally obtain images in front of the vehicle 12100. The imaging units 12102 and 12103 provided on the side mirrors principally obtain images of the sides of the vehicle 12100. The imaging unit 12104 provided on the rear bumper or the rear door principally obtains an image behind the vehicle 12100. The imaging unit 12105 provided on the upper portion of the front windshield in the vehicle interior is mainly used for detecting the preceding vehicle, a pedestrian, an obstacle, a traffic signal, a traffic sign, a lane and the like.

Note that, in FIG. 33, an example of imaging ranges of the imaging units 12101 to 12104 is illustrated. An imaging range 12111 indicates the imaging range of the imaging unit 12101 provided on the front nose, imaging ranges 12112 and 12113 indicate the imaging ranges of the imaging units 12102 and 12103 provided on the side mirrors, and an imaging range 12114 indicates the imaging range of the imaging unit 12104 provided on the rear bumper or the rear door. For example, image data taken by the imaging units 12101 to 12104 are superimposed, so that an overlooking image of the vehicle 12100 as seen from above is obtained.

At least one of the imaging units 12101 to 12104 may have a function of obtaining distance information. For example, at least one of the imaging units 12101 to 12104 may be a stereo camera including a plurality of imaging elements, or may be an imaging element including pixels for phase difference detection.

For example, the microcomputer 12051 may extract especially a closest solid object on a traveling path of the vehicle 12100, the solid object traveling at a predetermined speed (for example, 0 km/h or higher) in a direction substantially the same as that of the vehicle 12100 as the preceding vehicle by obtaining a distance to each solid object in the imaging ranges 12111 to 12114 and a change in time of the distance (relative speed relative to the vehicle 12100) on the basis of the distance information obtained from the imaging units 12101 to 12104. Moreover, the microcomputer 12051 may set the distance between the vehicles to be secured in advance from the preceding vehicle, and may perform automatic brake control (including following stop control), automatic acceleration control (including following start control) and the like. In this manner, it is possible to perform the cooperative control for realizing the automatic driving and the like to autonomously travel independent from the operation of the driver.

For example, the microcomputer 12051 may extract solid object data regarding the solid object while sorting the same into a motorcycle, a standard vehicle, a large-sized vehicle, a pedestrian, and other solid objects such as a utility pole on the basis of the distance information obtained from the imaging units 12101 to 12104 and use for automatically avoiding obstacles. For example, the microcomputer 12051 discriminates the obstacles around the vehicle 12100 into an obstacle visible to a driver of the vehicle 12100 and an obstacle difficult to see. Then, the microcomputer 12051 determines a collision risk indicating a degree of risk of collision with each obstacle, and when the collision risk is equal to or higher than a set value and there is a possibility of collision, this may perform driving assistance for avoiding the collision by outputting an alarm to the driver via the audio speaker 12061 and the display unit 12062 or performing forced deceleration or avoidance steering via the drive system control unit 12010.

At least one of the imaging units 12101 to 12104 may be an infrared camera for detecting infrared rays. For example, the microcomputer 12051 may recognize a pedestrian by determining whether or not there is a pedestrian in the images taken by the imaging units 12101 to 12104. Such pedestrian recognition is carried out, for example, by a procedure of extracting feature points in the images taken by the imaging units 12101 to 12104 as the infrared cameras and a procedure of performing pattern matching processing on a series of feature points indicating an outline of an object to discriminate whether or not this is a pedestrian. When the microcomputer 12051 determines that there is a pedestrian in the images taken by the imaging units 12101 to 12104 and recognizes the pedestrian, the audio image output unit 12052 controls the display unit 12062 to superimpose a rectangular contour for emphasis on the recognized pedestrian. Furthermore, the audio image output unit 12052 may control the display unit 12062 to display an icon and the like indicating the pedestrian at a desired position.

An example of the vehicle control system to which the technology according to the present disclosure may be applied is described above. The technology according to the present disclosure may be applied to the imaging unit 12031, for example, out of the configurations described above. Specifically, the imaging device 100 in FIG. 1 may be applied to the imaging unit 12031. By applying the technology according to the present disclosure to the imaging unit 12031, it is possible to reduce the circuit mounting area and downsize the imaging unit 12031.

Note that, the above-described embodiments describe an example of embodying the present technology, and there is a correspondence relationship between matters in the embodiments and the matters specifying the invention in claims. Similarly, there is a correspondence relationship between the matters specifying the invention in claims and the matters in the embodiments of the present technology assigned with the same names. However, the present technology is not limited to the embodiments and may be embodied with various modifications of the embodiment without departing from the spirit thereof.

Furthermore, the procedures described in the above-described embodiments may be considered as a method including a series of procedures and may be considered as a program for allowing a computer to execute the series of procedures and a recording medium which stores the program. A compact disc (CD), a MiniDisc (MD), a digital versatile disc (DVD), a memory card, a Blu-ray (TM) Disc and the like may be used, for example, as the recording medium.

Note that, the effect described in this specification is illustrative only and is not limitative; there may also be another effect.

Note that, the present technology may also have a following configuration.

(1) A solid-state imaging element provided with:

a plurality of photoelectric conversion elements each of which photoelectrically converts incident light to generate a first electric signal; and a detection unit that detects whether or not a change amount of the first electric signal of each of the plurality of photoelectric conversion elements exceeds a predetermined threshold and outputs a detection signal indicating a result of the detection.

(2) The solid-state imaging element according to (1) described above, further provided with:

a signal supply unit that supplies the first electric signal of each of the plurality of photoelectric conversion elements to a connection node according to a predetermined control signal, in which the detection unit detects whether or not the change amount of the first electric signal supplied to the connection node exceeds the predetermined threshold.

(3) The solid-state imaging element according to (2) described above, further provided with:

a pixel signal generation unit that generates a pixel signal according to a second electric signal generated by the photoelectric conversion element, in which the signal supply unit sequentially selects the second electric signal of each of the plurality of photoelectric conversion elements to supply to the pixel signal generation unit in a case where the change amount exceeds the predetermined threshold.

(4) The solid-state imaging element according to (3) described above, in which the connection node is connected to N (N is an integer not smaller than 2) of the photoelectric conversion elements, and the pixel signal generation unit generates a signal of a voltage corresponding to the second electric signal of an element selected according to a selection signal out of M (M is an integer smaller than N) of the photoelectric conversion elements as the pixel signal.

(5) The solid-state imaging element according to (3) described above, in which the pixel signal generation unit is provided with:

a reset transistor that initializes a floating diffusion layer;

an amplification transistor that amplifies a signal of a voltage of the floating diffusion layer; and a selection transistor that outputs the amplified signal as the pixel signal according to a selection signal, and the detection unit is provided with:

a plurality of N-type transistors that converts the first electric signal into a voltage signal of a logarithm of the first electric signal; and a P-type transistor that supplies a constant current to the plurality of N-type transistors.

(6) The solid-state imaging element according to (5) described above, in which the plurality of photoelectric conversion elements is arranged on a light reception chip, and the detection unit and the pixel signal generation unit are arranged on a detection chip stacked on the light reception chip.

(7) The solid-state imaging element according to (5) described above, in which the plurality of photoelectric conversion elements and the reset transistor are arranged on a light reception chip, and the detection unit, the amplification transistor, and the selection transistor are arranged on a detection chip stacked on the light reception chip.

(8) The solid-state imaging element according to (5) described above, in which the plurality of photoelectric conversion elements, the reset transistor, and the plurality of N-type transistors are arranged on a light reception chip, and the amplification transistor, the selection transistor, and the P-type transistor are arranged on a detection chip stacked on the light reception chip.

(9) The solid-state imaging element according to (5) described above,
in which the plurality of photoelectric conversion elements, the pixel signal generation unit, and the plurality of N-type transistors are arranged on a light reception chip, and
the P-type transistor is arranged on a detection chip stacked on the light reception chip.

(10) The solid-state imaging element according to (1) described above, further provided with:
a signal supply unit that supplies the first electric signal of each of the plurality of photoelectric conversion elements to a connection node according to a predetermined control signal,
in which the detection unit further outputs a pixel signal corresponding to the first electric signal,
the signal supply unit sequentially selects the first electric signal of each of the plurality of photoelectric conversion elements to supply to the connection node in a case where the change amount exceeds the predetermined threshold, and
the detection unit is provided with:
first and second N-type transistors that convert the first electric signal into a voltage signal of a logarithm of the first electric signal; and
a P-type transistor that supplies a constant current to the first and second N-type transistors.

(11) The solid-state imaging element according to (10) described above, further provided with:
an analog/digital converter that converts the pixel signal into a digital signal,
in which the plurality of photoelectric conversion elements, the signal supply unit, and the first and second N-type transistors are arranged on a light reception chip, and
the P-type transistor and at least a part of the analog/digital converter are arranged on a detection chip stacked on the light reception chip.

(12) The solid-state imaging element according to (11) described above,
in which the analog/digital converter is provided with:
a signal side transistor to which the pixel signal is input;
a reference side transistor to which a predetermined reference signal is input;
a constant current source connected to the signal side transistor and the reference side transistor; and
a current mirror circuit that amplifies a difference between the pixel signal and the predetermined reference signal to output,
the plurality of photoelectric conversion elements, the signal supply unit, the first and second N-type transistors, the signal side transistor, the reference side transistor, and the constant current source are arranged on a light reception chip, and
the P-type transistor and the current mirror circuit are arranged on a detection chip stacked on the light reception chip.

(13) The solid-state imaging element according to (1) described above, further provided with:
a connection node connected to the photoelectric conversion element and the detection unit; and
for each of the plurality of photoelectric conversion elements, a current/voltage conversion unit that converts a photocurrent into a voltage signal of a logarithm of the photocurrent, a buffer that corrects the voltage signal to output, a capacitor inserted between the buffer and the connection node, and a signal processing unit that supplies an electric signal of each of the plurality of photoelectric conversion elements to the connection node through the current/voltage conversion unit, the buffer, and the capacitor according to a predetermined control signal,
in which the electric signal includes the photocurrent and the voltage signal.

(14) The solid-state imaging element according to (13) described above, further provided with:
an analog/digital converter that converts a pixel signal into a digital signal,
in which each of a predetermined number of current/voltage conversion units arranged in a predetermined direction further generates a signal of a voltage corresponding to the photocurrent as the pixel signal, and outputs the pixel signal to the analog/digital converter.

(15) The solid-state imaging element according to (13) described above, further provided with:
an analog/digital converter that converts a pixel signal into a digital signal for each of the plurality of photoelectric conversion elements,
in which each of current/voltage conversion units further generates a signal of a voltage corresponding to the photocurrent as the pixel signal, and outputs the pixel signal to the analog/digital converter.

(16) A solid-state imaging element provided with:
a photoelectric conversion element that photoelectrically converts incident light to generate an electric signal;
a signal supply unit that supplies the electric signal to either a connection node or a floating diffusion layer according to a predetermined control signal;
a detection unit that detects whether or not a change amount of the electric signal supplied to the connection node exceeds a predetermined threshold and outputs a detection signal indicating a result of the detection; and
a pixel signal generation unit that generates a voltage signal corresponding to the electric signal supplied to the floating diffusion layer as a pixel signal.

(17) The solid-state imaging element according to (16) described above,
in which the signal supply unit includes:
a first transistor that supplies the electric signal to the connection node according to a predetermined control signal; and
a second transistor that supplies the electric signal to a floating diffusion layer according to a predetermined control signal,
the pixel signal generation unit is arranged in each of a plurality of pixels, and
the first transistor and the detection unit are arranged in a pixel being a detection target out of the plurality of pixels.

(18) An imaging device provided with:
a plurality of photoelectric conversion elements each of which photoelectrically converts incident light to generate an electric signal;
a signal supply unit that supplies the electric signal of each of the plurality of photoelectric conversion elements to a connection node according to a predetermined control signal;
a detection unit that detects whether or not a change amount of the electric signal supplied to the connection node exceeds a predetermined threshold and outputs a detection signal indicating a result of the detection; and
a recording unit that records the detection signal.

(19) A control method of a solid-state imaging element, the method provided with:
a signal supplying step of supplying, to a connection node, an electric signal of each of a plurality of photoelectric conversion elements each of which photoelectrically converts incident light to generate the electric signal according to a predetermined control signal; and a detecting step of detecting whether or not a change amount of the electric signal supplied to the connection node exceeds a predetermined threshold and outputting a detection signal indicating a result of the detection.

(20) A solid-state imaging element provided with:

a first photoelectric conversion element that generates a first electric signal;

a second photoelectric conversion element that generates a second electric signal;

a detection unit that detects whether or not at least any one of a change amount of the first electric signal or a change amount of the second electric signal exceeds a predetermined threshold to output a detection signal indicating a result of the detection; and a connection node connected to the first photoelectric conversion element, the second photoelectric conversion element, and the detection unit.

(21) The solid-state imaging element according to (20) described above, further provided with:

a first transistor that supplies the first electric signal to the connection node according to a first control signal; and a second transistor that supplies the second electric signal to the connection node according to a second control signal, in which the detection unit detects whether or not a change amount of either the first or second electric signal supplied to the connection node exceeds the predetermined threshold.

(22) The solid-state imaging element according to (21) described above, further provided with:

a pixel signal generating unit that generates a first pixel signal according to a third electric signal generated by the first photoelectric conversion element and generates a second pixel signal according to a fourth electric signal generated by the second photoelectric conversion element;

a third transistor connected to the first photoelectric conversion element and the pixel signal generating unit; and a fourth transistor connected to the second photoelectric conversion element and the pixel signal generating unit, in which the third transistor supplies the third electric signal to the pixel signal generating unit in a case where the change amount of the first electric signal exceeds the predetermined threshold, and the fourth transistor supplies the fourth electric signal to the pixel signal generating unit in a case where the change amount of the second electric signal exceeds the predetermined threshold

(23) The solid-state imaging element according to (22) described above, in which the pixel signal generating unit includes:

a first pixel signal generation unit that generates a first pixel signal according to the third electric signal generated by the first photoelectric conversion element; and a second pixel signal generation unit that generates a second pixel signal according to the fourth electric signal generated by the second photoelectric conversion element, the third transistor supplies the third electric signal to the first pixel signal generation unit in a case where the change amount of the first electric signal exceeds the predetermined threshold, and the fourth transistor supplies the fourth electric signal to the second pixel signal generation unit in a case where the change amount of the second electric signal exceeds the predetermined threshold

(24) The solid-state imaging element according to (22) described above, further provided with:

a third photoelectric conversion element that generates a fifth electric signal and a sixth electric signal;

a fifth transistor that supplies an electric signal of the fifth photoelectric conversion element to the connection node according to a third control signal; and a second pixel signal generating unit that generates a third pixel signal according to the sixth electric signal, in which the sixth transistor supplies the sixth electric signal to the second pixel signal generating unit in a case where a change amount of the fifth electric signal exceeds the predetermined threshold.

(25) The solid-state imaging element according to (22) described above, in which the pixel signal generating unit is provided with:

a reset transistor that initializes a floating diffusion layer;

an amplification transistor that amplifies a signal of a voltage of the floating diffusion layer; and a selection transistor that outputs the amplified signal as the first or second pixel signal according to a selection signal, and the detection unit is provided with:

a plurality of N-type transistors that converts a photocurrent into a voltage signal of a logarithm of the photocurrent; and a P-type transistor that supplies a constant current to the plurality of N-type transistors.

(26) The solid-state imaging element according to (20) described above, the first electric signal including a first photocurrent, and the second electric signal including a second photocurrent, the solid-state imaging element further provided with:

a connection node connected to the first photoelectric conversion element, the second photoelectric conversion element, and the detection unit;

a first current/voltage conversion unit that converts at least one of the first photocurrent or the second photocurrent into a voltage signal of a logarithm of the photocurrent;

a buffer that corrects the voltage signal to output;

a capacitor inserted between the buffer and the connection node; and a signal processing unit that supplies at least one of the first electric signal or the second electric signal to the connection node through the current/voltage conversion unit, the buffer, and the capacitor according to a predetermined control signal, in which the first photoelectric conversion element generates the first photocurrent, and the second photoelectric conversion element generates the second photocurrent.

(27) The solid-state imaging element according to (26) described above, further provided with:

an analog/digital converter connected to the first current/voltage conversion unit and the second current/voltage conversion unit, in which the first current/voltage conversion unit further generates a signal of a voltage corresponding to the first photocurrent as a first pixel signal, and outputs the first pixel signal to the analog/digital converter, and the second current/voltage conversion unit further generates a signal of a voltage corresponding to the second photocurrent as a second pixel signal, and outputs the second pixel signal to the analog/digital converter.

(28) The solid-state imaging element according to (26) described above, further provided with:

a first analog/digital converter that converts a first pixel signal into a first digital signal; and a second analog/digital converter that converts a second pixel signal into a second digital signal, in which the first current/voltage conversion unit further generates a signal of a voltage corresponding to the first photocurrent as the first pixel signal, and outputs the first pixel signal to the first analog/digital converter, and the second current/voltage conversion unit further generates a signal of a voltage corresponding to the second photocurrent as the second pixel signal, and outputs the second pixel signal to the second analog/digital converter.

(29) A solid-state imaging element provided with:

a first photoelectric conversion element that photoelectrically converts incident light to generate a first electric signal and a second electric signal;

a first signal supply unit that supplies the first electric signal to a connection node according to a first control signal;

a second signal supply unit that supplies the second electric signal to a first floating diffusion layer according to a second control signal;

a detection unit that detects whether or not a change amount of the first electric signal supplied to the connection node exceeds a predetermined threshold and outputs a detection signal indicating a result of the detection; and a first pixel signal generation unit that generates a first pixel signal corresponding to the second electric signal supplied to the first floating diffusion layer.

(30) The solid-state imaging element according to (29) described above, further provided with:

a second photoelectric conversion element that photoelectrically converts incident light to generate a third electric signal;

a third transistor that supplies to a second floating diffusion layer according to a third control signal; and a second pixel signal generation unit that generates a voltage signal corresponding to the third electric signal supplied to the second floating diffusion layer as a second pixel signal.

(31) An imaging device provided with:

a first photoelectric conversion element that photoelectrically converts incident light to generate a first electric signal;

a second photoelectric conversion element that photoelectrically converts the incident light to generate a second electric signal;

a first signal supply unit that supplies the first electric signal to a connection node according to a first control signal;

a second signal supply unit that supplies the second electric signal to the connection node according to a second control signal;

a detection unit that detects whether or not a change amount of the electric signal supplied to the connection node exceeds a predetermined threshold and outputs a detection signal indicating a result of the detection; and a recording unit that records the detection signal.

(32) A control method of a solid-state imaging element, the method provided with:

a signal supplying step of supplying a first electric signal generated by photoelectric conversion of incident light by a first photoelectric conversion element to a connection node according to a first control signal and supplying a second electric signal generated by photoelectric conversion of the incident light by a second photoelectric conversion element to the connection node according to a second control signal; and a detecting step of detecting whether or not a change amount of the electric signal supplied to the connection node exceeds a predetermined threshold and outputting a detection signal indicating a result of the detection.

(33) A solid-state imaging element provided with:

a first photoelectric conversion element that photoelectrically converts incident light to generate first and second electric signals;

a second photoelectric conversion element that photoelectrically converts the incident light to generate third and fourth electric signals;

a first detection unit that detects whether or not a change amount of the first electric signal exceeds a predetermined threshold and outputs a detection signal indicating a result of the detection;

a second detection unit that detects whether or not a change amount of the third electric signal exceeds a predetermined threshold and outputs a detection signal indicating a result of the detection;

a first transistor that supplies the first electric signal to the first detection unit according to a first control signal;

a second transistor that supplies the third electric signal to the second detection unit according to a second control signal;

a pixel signal generation unit that generates a pixel signal corresponding to any one of the second or fourth pixel signal;

a third transistor that supplies the second electric signal to the pixel signal generation unit according to a third control signal; and a fourth transistor that supplies the fourth electric signal to the pixel signal generation unit according to a fourth control signal.

REFERENCE SIGNS LIST

100 Imaging device
110 Imaging lens
120 Recording unit
130 Control unit
200 Solid-state imaging element
201 Light reception chip
202 Detection chip
211 Drive circuit
212 Signal processing unit
213 Arbiter
220 Column ADC
221 Reference signal generation unit
222 Output unit
230 ADC
231 Comparator
232 Counter
233 Switch
234 Memory
240 Differential amplification circuit
241, 242, 412 P-type transistor
243, 244, 245, 411, 413 N-type transistor
250 Counter
300 Pixel array unit
310 Pixel block
311 Pixel
312 Normal pixel
313 Address event detection pixel
320 Pixel signal generation unit
321 Reset transistor
322 Amplification transistor
323 Selection transistor 324 Floating diffusion layer
330 Light reception unit
331 Transfer transistor
332 OFG transistor
333 Photoelectric conversion element
400 Address event detection unit
410 Current/voltage conversion unit
420 Buffer
430 Subtractor
431, 433 Capacitor
432 Inverter
434 Switch
440 Quantizer
441 Comparator
450 Transfer unit
12031 Imaging unit

The invention claimed is:

1. A solid-state imaging element comprising:
a plurality of photoelectric conversion elements each of which photoelectrically converts incident light to generate a first electric signal;
a detection circuit configured to detect whether or not a change amount of the first electric signal of each of the plurality of photoelectric conversion elements exceeds a predetermined threshold and outputs a detection signal indicating a result of the detection;
a signal supply circuit configured to supply the first electric signal of each of the plurality of photoelectric conversion elements to a connection node according to a predetermined control signal; and
a pixel signal generation circuit configured to generate a pixel signal according to a second electric signal generated by the photoelectric conversion element, wherein
the detection circuit detects whether or not the change amount of the first electric signal supplied to the connection node exceeds the predetermined threshold,
the signal supply circuit sequentially selects the second electric signal of each of the plurality of photoelectric conversion elements to supply to the pixel signal generation circuit in a case where the change amount exceeds the predetermined threshold,
the pixel signal generation circuit includes:
a reset transistor that initializes a floating diffusion layer;
an amplification transistor that amplifies a signal of a voltage of the floating diffusion layer; and
a selection transistor that outputs the amplified signal as the pixel signal according to a selection signal, and
the detection circuit includes:
a plurality of N-type transistors that converts the first electric signal into a voltage signal of a logarithm of the first electric signal; and
a P-type transistor that supplies a constant current to the plurality of N-type transistors.

2. The solid-state imaging element according to claim 1, wherein
the connection node is connected to N (N is an integer not smaller than 2) of the photoelectric conversion elements, and
the pixel signal generation circuit generates a signal of a voltage corresponding to the second electric signal of an element selected according to the selection signal out of M (M is an integer smaller than N) of the photoelectric conversion elements as the pixel signal.

3. The solid-state imaging element according to claim 1, wherein
the plurality of photoelectric conversion elements is arranged on a light reception chip, and
the detection circuit and the pixel signal generation circuit are arranged on a detection chip stacked on the light reception chip.

4. The solid-state imaging element according to claim 1, wherein
the plurality of photoelectric conversion elements and the reset transistor are arranged on a light reception chip, and
the detection circuit, the amplification transistor, and the selection transistor are arranged on a detection chip stacked on the light reception chip.

5. The solid-state imaging element according to claim 1, wherein
the plurality of photoelectric conversion elements, the reset transistor, and the plurality of N-type transistors are arranged on a light reception chip, and
the amplification transistor, the selection transistor, and the P-type transistor are arranged on a detection chip stacked on the light reception chip.

6. The solid-state imaging element according to claim 1, wherein
the plurality of photoelectric conversion elements, the pixel signal generation circuit, and the plurality of N-type transistors are arranged on a light reception chip, and
the P-type transistor is arranged on a detection chip stacked on the light reception chip.

7. The solid-state imaging element according to claim 1, wherein:
the connection node is connected to the photoelectric conversion element and the detection circuit; and
for each of the plurality of photoelectric conversion elements, a current/voltage conversion circuit unit that converts a photocurrent into a voltage signal of a logarithm of the photocurrent, a buffer that corrects the voltage signal to output, a capacitor inserted between the buffer and the connection node, and a signal processor that supplies an electric signal of each of the plurality of photoelectric conversion elements to the connection node through the current/voltage conversion circuit, the buffer, and the capacitor according to a predetermined control signal, and wherein
the electric signal includes the photocurrent and the voltage signal.

8. The solid-state imaging element according to claim 7, further comprising:
an analog/digital converter that converts a pixel signal into a digital signal, wherein
each of a predetermined number of current/voltage conversion circuits arranged in a predetermined direction further generates a signal of a voltage corresponding to the photocurrent as the pixel signal, and outputs the pixel signal to the analog/digital converter.

9. The solid-state imaging element according to claim 7, further comprising:
an analog/digital converter that converts a pixel signal into a digital signal for each of the plurality of photoelectric conversion elements, wherein
each of current/voltage conversion circuits further generates a signal of a voltage corresponding to the photocurrent as the pixel signal, and outputs the pixel signal to the analog/digital converter.

10. A solid-state imaging element comprising:
a plurality of photoelectric conversion elements each of which photoelectrically converts incident light to generate a first electric signal;
a detection circuit configured to detect whether or not a change amount of the first electric signal of each of the plurality of photoelectric conversion elements exceeds a predetermined threshold and outputs a detection signal indicating a result of the detection;
a signal supply circuit configured to supply the first electric signal of each of the plurality of photoelectric conversion elements to a connection node according to a predetermined control signal, wherein
the detection circuit outputs a pixel signal corresponding to the first electric signal,
the signal supply circuit sequentially selects the first electric signal of each of the plurality of photoelectric conversion elements to supply to the connection node in a case where the change amount exceeds the predetermined threshold, and
the detection circuit includes:
first and second N-type transistors that convert the first electric signal into a voltage signal of a logarithm of the first electric signal; and
a P-type transistor that supplies a constant current to the first and second N-type transistors.

11. The solid-state imaging element according to claim 10, further comprising:
an analog/digital converter that converts the pixel signal into a digital signal, wherein
the plurality of photoelectric conversion elements, the signal supply circuit, and the first and second N-type transistors are arranged on a light reception chip, and
the P-type transistor and at least a part of the analog/digital converter are arranged on a detection chip stacked on the light reception chip.

12. The solid-state imaging element according to claim 11, wherein
the analog/digital converter includes:
a signal side transistor to which the pixel signal is input;
a reference side transistor to which a predetermined reference signal is input;
a constant current source connected to the signal side transistor and the reference side transistor; and
a current mirror circuit that amplifies a difference between the pixel signal and the predetermined reference signal to output, wherein
the plurality of photoelectric conversion elements, the signal supply circuit, the first and second N-type transistors, the signal side transistor, the reference side transistor, and the constant current source are arranged on a light reception chip, and
the P-type transistor and the current mirror circuit are arranged on a detection chip stacked on the light reception chip.

13. A solid-state imaging element comprising:
a first photoelectric conversion element that generates a first electric signal;
a second photoelectric conversion element that generates a second electric signal;
a detection circuit configured to detect whether or not at least any one of a change amount of the first electric signal or a change amount of the second electric signal exceeds a predetermined threshold to output a detection signal indicating a result of the detection;
a connection node connected to the first photoelectric conversion element, the second photoelectric conversion element, and the detection circuit;
a first transistor that supplies the first electric signal to the connection node according to a first control signal;
a second transistor that supplies the second electric signal to the connection node according to a second control signal;
a pixel signal generating circuit that generates a first pixel signal according to a third electric signal generated by the first photoelectric conversion element and generates a second pixel signal according to a fourth electric signal generated by the second photoelectric conversion element;
a third transistor connected to the first photoelectric conversion element and the pixel signal generating circuit; and
a fourth transistor connected to the second photoelectric conversion element and the pixel signal generating circuit, wherein
the detection circuit detects whether or not a change amount of either the first or second electric signal supplied to the connection node exceeds the predetermined threshold,
the third transistor supplies the third electric signal to the pixel signal generating circuit in a case where the change amount of the first electric signal exceeds the predetermined threshold,
the fourth transistor supplies the fourth electric signal to the pixel signal generating circuit in a case where the change amount of the second electric signal exceeds the predetermined threshold,
the pixel signal generating circuit includes:
a reset transistor that initializes a floating diffusion layer;
an amplification transistor that amplifies a signal of a voltage of the floating diffusion layer; and
a selection transistor that outputs the amplified signal as the first or second pixel signal according to a selection signal, and
the detection circuit includes:
a plurality of N-type transistors that converts a photocurrent into a voltage signal of a logarithm of the photocurrent; and
a P-type transistor that supplies a constant current to the plurality of N-type transistors.

14. The solid-state imaging element according to claim 13,
wherein
the pixel signal generating circuit includes:
a first pixel signal generation circuit that generates a first pixel signal according to the third electric signal generated by the first photoelectric conversion element; and
a second pixel signal generation circuit that generates a second pixel signal according to the fourth electric signal generated by the second photoelectric conversion element,
the third transistor supplies the third electric signal to the first pixel signal generation circuit in a case where the change amount of the first electric signal exceeds the predetermined threshold, and
the fourth transistor supplies the fourth electric signal to the second pixel signal generation circuit in a case where the change amount of the second electric signal exceeds the predetermined threshold.

15. The solid-state imaging element according to claim 13, further comprising:

a third photoelectric conversion element that generates a fifth electric signal and a sixth electric signal;

a fifth transistor that supplies an electric signal of the third photoelectric conversion element to the connection node according to a third control signal; and a second pixel signal generating circuit that generates a third pixel signal according to the sixth electric signal, wherein a sixth transistor supplies the sixth electric signal to the second pixel signal generating circuit in a case where a change amount of the fifth electric signal exceeds the predetermined threshold.

16. The solid-state imaging element according to claim 13, wherein the first electric signal includes a first photocurrent, and the second electric signal includes a second photocurrent, and wherein the solid-state imaging element further comprises:

a connection node connected to the first photoelectric conversion element, the second photoelectric conversion element, and the detection circuit;

a first current/voltage conversion circuit that converts at least one of the first photocurrent or the second photocurrent into a voltage signal of a logarithm of the photocurrent;

a buffer that corrects the voltage signal to output;

a capacitor inserted between the buffer and the connection node; and a signal processor that supplies at least one of the first electric signal or the second electric signal to the connection node through the current/voltage conversion circuit, the buffer, and the capacitor according to a predetermined control signal, wherein the first photoelectric conversion element generates the first photocurrent, and the second photoelectric conversion element generates the second photocurrent.

17. The solid-state imaging element according to claim 16, further comprising:

an analog/digital converter connected to the first current/voltage conversion circuit and the second current/voltage conversion circuit, wherein the first current/voltage conversion circuit further generates a signal of a voltage corresponding to the first photocurrent as a first pixel signal, and outputs the first pixel signal to the analog/digital converter, and a second current/voltage conversion circuit further generates a signal of a voltage corresponding to the second photocurrent as a second pixel signal, and outputs the second pixel signal to the analog/digital converter.

18. The solid-state imaging element according to claim 16, further comprising:

a first analog/digital converter that converts a first pixel signal into a first digital signal; and a second analog/digital converter that converts a second pixel signal into a second digital signal, wherein the first current/voltage conversion circuit further generates a signal of a voltage corresponding to the first photocurrent as the first pixel signal, and outputs the first pixel signal to the first analog/digital converter, and a second current/voltage conversion circuit further generates a signal of a voltage corresponding to the second photocurrent as the second pixel signal, and outputs the second pixel signal to the second analog/digital converter.

* * * * *